(12) United States Patent
Chen et al.

(10) Patent No.: US 8,698,376 B2
(45) Date of Patent: Apr. 15, 2014

(54) MICROELECTROMECHANICAL SYSTEMS (MEMS) RESONATORS AND RELATED APPARATUS AND METHODS

(71) Applicants: David M. Chen, Brookline, MA (US); Jan H. Kuypers, Cambridge, MA (US); Pritiraj Mohanty, Los Angeles, CA (US); Klaus Juergen Schoepf, Chandler, AZ (US); Guiti Zolfagharkhani, Brighton, MA (US); Jason Goodelle, Boston, MA (US); Reimund Rebel, Maricopa, AZ (US)

(72) Inventors: David M. Chen, Brookline, MA (US); Jan H. Kuypers, Cambridge, MA (US); Pritiraj Mohanty, Los Angeles, CA (US); Klaus Juergen Schoepf, Chandler, AZ (US); Guiti Zolfagharkhani, Brighton, MA (US); Jason Goodelle, Boston, MA (US); Reimund Rebel, Maricopa, AZ (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 13/681,904

(22) Filed: Nov. 20, 2012

(65) Prior Publication Data

US 2013/0140944 A1 Jun. 6, 2013

Related U.S. Application Data

(60) Division of application No. 13/466,767, filed on May 8, 2012, now Pat. No. 8,476,809, which is a continuation-in-part of application No. 12/750,768, filed on Mar. 31, 2010, and a continuation-in-part of application No. 12/781,076, filed on May 17, 2010, now Pat. No. 8,410,868, and a continuation-in-part of (Continued)

(51) Int. Cl.
*H01L 41/04* (2006.01)
(52) U.S. Cl.
USPC ........... 310/328; 310/309; 310/340; 310/348; 310/338
(58) Field of Classification Search
USPC .......................... 310/309, 328, 340, 344, 338
See application file for complete search history.

(56) References Cited

U.S. PATENT DOCUMENTS

| 1,785,036 A | 12/1930 | Marrison |
| 3,644,761 A | 2/1972 | Doi et al. |

(Continued)

FOREIGN PATENT DOCUMENTS

| EP | 0503892 A1 | 9/1992 |
| JP | 62-245811 | 10/1987 |

(Continued)

OTHER PUBLICATIONS

International Search Report and International Preliminary Report on Patentability for PCT/US2006/021298 mailed Nov. 6, 2006 and Dec. 6, 2007 respectively.

(Continued)

*Primary Examiner* — Thomas Dougherty
(74) *Attorney, Agent, or Firm* — Wolf, Greenfield & Sacks, P.C.

(57) ABSTRACT

Devices having piezoelectric material structures integrated with substrates are described. Fabrication techniques for forming such devices are also described. The fabrication may include bonding a piezoelectric material wafer to a substrate of a differing material. A structure, such as a resonator, may then be formed from the piezoelectric material wafer.

6 Claims, 17 Drawing Sheets

Related U.S. Application Data

(60) application No. 12/899,447, filed on Oct. 6, 2010, now Pat. No. 8,466,606, which is a continuation-in-part of application No. 12/750,768, filed on Mar. 31, 2010, said application No. 13/466,767 is a continuation-in-part of application No. 13/191,851, filed on Jul. 27, 2011, and a continuation-in-part of application No. 13/247,318, filed on Sep. 28, 2011, now abandoned, which is a continuation-in-part of application No. 12/111,535, filed on Apr. 29, 2008, now Pat. No. 8,044,736.

(60) Provisional application No. 61/165,405, filed on Mar. 31, 2009, provisional application No. 61/184,167, filed on Jun. 4, 2009, provisional application No. 61/368,227, filed on Jul. 27, 2010, provisional application No. 61/368,216, filed on Jul. 27, 2010, provisional application No. 61/368,218, filed on Jul. 27, 2010, provisional application No. 61/368,224, filed on Jul. 27, 2010.

(56) References Cited

U.S. PATENT DOCUMENTS

| | | | |
|---|---|---|---|
| 4,862,114 | A | 8/1989 | Kleinberg |
| 5,260,596 | A | 11/1993 | Dunn et al. |
| 5,327,104 | A | 7/1994 | Kikushima |
| 5,455,547 | A | 10/1995 | Lin et al. |
| 5,473,289 | A | 12/1995 | Ishizaki et al. |
| 5,491,604 | A | 2/1996 | Nguyen et al. |
| 5,525,855 | A | 6/1996 | Gotoh et al. |
| 5,537,083 | A | 7/1996 | Lin et al. |
| 5,587,620 | A | 12/1996 | Ruby et al. |
| 5,589,082 | A | 12/1996 | Lin et al. |
| 5,596,243 | A | 1/1997 | Tsuru et al. |
| 5,640,133 | A | 6/1997 | MacDonald et al. |
| 5,644,271 | A | 7/1997 | Molloy et al. |
| 5,839,062 | A | 11/1998 | Nguyen et al. |
| 5,847,489 | A | 12/1998 | Satoh et al. |
| 5,883,550 | A | 3/1999 | Watanabe et al. |
| 5,914,553 | A | 6/1999 | Adams et al. |
| 5,959,516 | A | 9/1999 | Chang et al. |
| 6,060,692 | A | 5/2000 | Bartley et al. |
| 6,124,765 | A | 9/2000 | Chan et al. |
| 6,227,809 | B1* | 5/2001 | Forster et al. .................. 417/53 |
| 6,236,281 | B1 | 5/2001 | Nguyen et al. |
| 6,249,073 | B1 | 6/2001 | Nguyen et al. |
| 6,383,924 | B1 | 5/2002 | Farrar et al. |
| 6,424,074 | B2 | 7/2002 | Nguyen |
| 6,548,942 | B1 | 4/2003 | Panasik |
| 6,557,419 | B1 | 5/2003 | Herb et al. |
| 6,577,040 | B2 | 6/2003 | Nguyen |
| 6,579,738 | B2 | 6/2003 | Farrar et al. |
| 6,593,831 | B2 | 7/2003 | Nguyen |
| 6,600,252 | B2 | 7/2003 | Nguyen |
| 6,630,871 | B2 | 10/2003 | Ma et al. |
| 6,667,558 | B2 | 12/2003 | Wong et al. |
| 6,680,660 | B2 | 1/2004 | Nguyen |
| 6,710,680 | B2 | 3/2004 | Niu et al. |
| 6,713,938 | B2 | 3/2004 | Nguyen |
| 6,734,762 | B2 | 5/2004 | Cornett et al. |
| 6,737,939 | B2 | 5/2004 | Hoppe et al. |
| 6,739,190 | B2 | 5/2004 | Hsu et al. |
| 6,815,826 | B2 | 11/2004 | Farrar et al. |
| 6,828,713 | B2 | 12/2004 | Bradley et al. |
| 6,831,531 | B1 | 12/2004 | Giousouf et al. |
| 6,841,408 | B2 | 1/2005 | Farrar et al. |
| 6,856,217 | B1 | 2/2005 | Clark et al. |
| 6,859,113 | B2 | 2/2005 | Giousouf et al. |
| 6,861,914 | B2 | 3/2005 | Photiadis et al. |
| 6,909,221 | B2 | 6/2005 | Ayazi et al. |
| 6,917,138 | B2 | 7/2005 | Nguyen |
| 6,930,569 | B2 | 8/2005 | Hsu |
| 6,936,954 | B2 | 8/2005 | Peczalski |
| 6,940,370 | B2 | 9/2005 | Bircumshaw et al. |
| 6,943,484 | B2 | 9/2005 | Clark et al. |
| 6,949,839 | B2 | 9/2005 | Farrar et al. |
| 6,954,020 | B2 | 10/2005 | Ma et al. |
| 6,958,566 | B2* | 10/2005 | Nguyen et al. ................. 310/321 |
| 6,987,432 | B2 | 1/2006 | Lutz et al. |
| 6,995,622 | B2 | 2/2006 | Partridge et al. |
| 7,005,946 | B2 | 2/2006 | Duwel et al. |
| 7,019,364 | B1 | 3/2006 | Sato et al. |
| 7,068,125 | B2 | 6/2006 | Lutz et al. |
| 7,098,753 | B1 | 8/2006 | Dumitrescu et al. |
| 7,102,467 | B2 | 9/2006 | Lutz et al. |
| 7,104,129 | B2 | 9/2006 | Nasiri et al. |
| 7,154,212 | B1 | 12/2006 | Kosinski |
| 7,164,188 | B2 | 1/2007 | Farrar et al. |
| 7,176,770 | B2 | 2/2007 | Ayazi et al. |
| 7,202,761 | B2 | 4/2007 | Lutz et al. |
| 7,211,926 | B2 | 5/2007 | Quevy et al. |
| 7,215,061 | B2 | 5/2007 | Kihara et al. |
| 7,235,456 | B2 | 6/2007 | Sato et al. |
| 7,247,246 | B2 | 7/2007 | Nasiri et al. |
| 7,248,128 | B2 | 7/2007 | Mattila et al. |
| 7,250,353 | B2 | 7/2007 | Nasiri et al. |
| 7,335,972 | B2* | 2/2008 | Chanchani .................... 257/686 |
| 7,352,608 | B2 | 4/2008 | Mohanty et al. |
| 7,358,822 | B2 | 4/2008 | Aubin et al. |
| 7,436,272 | B2 | 10/2008 | Fujii et al. |
| 7,442,570 | B2 | 10/2008 | Nasiri et al. |
| 7,469,588 | B2* | 12/2008 | LaFond et al. ............. 73/514.32 |
| 7,492,241 | B2 | 2/2009 | Piazza et al. |
| 7,504,909 | B2 | 3/2009 | Tada |
| 7,507,634 | B2 | 3/2009 | Sato et al. |
| 7,508,286 | B2 | 3/2009 | Ruby et al. |
| 7,545,239 | B2 | 6/2009 | Hagelin et al. |
| 7,621,183 | B2 | 11/2009 | Seeger et al. |
| 7,724,103 | B2 | 5/2010 | Feng et al. |
| 7,791,432 | B2 | 9/2010 | Piazza et al. |
| 7,808,332 | B1 | 10/2010 | Pedersen et al. |
| 7,812,680 | B1 | 10/2010 | Brown et al. |
| 7,830,215 | B2 | 11/2010 | Higuchi et al. |
| 7,956,517 | B1 | 6/2011 | Motiee et al. |
| 7,990,229 | B2 | 8/2011 | Gaidarzhy et al. |
| 2001/0006357 | A1 | 7/2001 | Yamamoto |
| 2002/0021245 | A1 | 2/2002 | Lin et al. |
| 2002/0096967 | A1* | 7/2002 | Ma et al. ........................ 310/309 |
| 2003/0186672 | A1 | 10/2003 | Buchaillot et al. |
| 2005/0056917 | A1* | 3/2005 | Kwon ........................... 257/678 |
| 2005/0073078 | A1 | 4/2005 | Lutz et al. |
| 2005/0218755 | A1 | 10/2005 | Song et al. |
| 2006/0082260 | A1 | 4/2006 | Kinoshita |
| 2006/0208326 | A1* | 9/2006 | Nasiri et al. ................... 257/414 |
| 2006/0214745 | A1 | 9/2006 | Park et al. |
| 2007/0044565 | A1 | 3/2007 | Aratake |
| 2007/0170440 | A1 | 7/2007 | Partridge et al. |
| 2007/0188254 | A1 | 8/2007 | Sutardja |
| 2007/0222336 | A1 | 9/2007 | Grannen et al. |
| 2007/0247245 | A1 | 10/2007 | Hagelin |
| 2007/0257728 | A1 | 11/2007 | Boser et al. |
| 2007/0257740 | A1 | 11/2007 | Boser et al. |
| 2007/0262831 | A1 | 11/2007 | Van Beek et al. |
| 2008/0048804 | A1 | 2/2008 | Volatier et al. |
| 2008/0079516 | A1 | 4/2008 | Ruby et al. |
| 2008/0136542 | A1 | 6/2008 | Hirama |
| 2008/0143217 | A1 | 6/2008 | Ho et al. |
| 2008/0204153 | A1 | 8/2008 | Yoshida et al. |
| 2008/0204173 | A1 | 8/2008 | Melamud et al. |
| 2008/0272852 | A1 | 11/2008 | Six |
| 2008/0284286 | A1 | 11/2008 | Ogawa et al. |
| 2009/0026882 | A1 | 1/2009 | Steeneken et al. |
| 2009/0108381 | A1 | 4/2009 | Buchwalter et al. |
| 2009/0108959 | A1 | 4/2009 | Piazza et al. |
| 2009/0144963 | A1 | 6/2009 | Piazza et al. |
| 2009/0233395 | A1* | 9/2009 | Pyo et al. ......................... 438/51 |
| 2009/0243747 | A1 | 10/2009 | Gaidarzhy et al. |
| 2009/0267699 | A1 | 10/2009 | Mohanty et al. |
| 2009/0267700 | A1 | 10/2009 | Mohanty et al. |
| 2009/0294638 | A1 | 12/2009 | Mohanty et al. |
| 2010/0007443 | A1 | 1/2010 | Mohanty et al. |
| 2010/0134207 | A1 | 6/2010 | Mohanty et al. |

(56) References Cited

U.S. PATENT DOCUMENTS

| | | | |
|---|---|---|---|
| 2010/0155883 A1 | 6/2010 | Wenzler et al. | |
| 2010/0181868 A1 | 7/2010 | Gaidarzhy et al. | |
| 2010/0182102 A1 | 7/2010 | Chen et al. | |
| 2010/0183174 A1* | 7/2010 | Suvanto et al. | 381/174 |
| 2010/0207489 A1* | 8/2010 | Huang | 310/336 |
| 2010/0301703 A1 | 12/2010 | Chen et al. | |
| 2010/0314969 A1 | 12/2010 | Bahreyni et al. | |
| 2010/0315170 A1 | 12/2010 | Locascio et al. | |
| 2010/0315179 A1 | 12/2010 | Schoepf et al. | |
| 2011/0121682 A1 | 5/2011 | Mohanty et al. | |
| 2011/0187227 A1 | 8/2011 | Chen et al. | |
| 2011/0284995 A1 | 11/2011 | Kuypers et al. | |
| 2012/0013410 A1 | 1/2012 | Rebel et al. | |
| 2012/0013413 A1 | 1/2012 | Mohanty et al. | |
| 2012/0074818 A1 | 3/2012 | Crowley et al. | |
| 2012/0091561 A1* | 4/2012 | Van Velzen et al. | 257/532 |
| 2012/0112765 A1* | 5/2012 | Sparks et al. | 324/633 |

FOREIGN PATENT DOCUMENTS

| | | |
|---|---|---|
| WO | WO 98/01948 A1 | 1/1998 |
| WO | WO 98/37635 A1 | 8/1998 |
| WO | WO 02/17481 A2 | 2/2002 |
| WO | WO 2005/029700 A1 | 3/2005 |
| WO | WO 2006/000611 A1 | 1/2006 |
| WO | WO 2006/083482 A2 | 8/2006 |
| WO | WO 2006/121920 | 11/2006 |
| WO | WO 2007/072408 A2 | 6/2007 |
| WO | WO 2007/072409 A2 | 6/2007 |
| WO | WO 2007/143520 A2 | 12/2007 |
| WO | WO 2008/118383 A1 | 10/2008 |
| WO | WO 2008/149298 A1 | 12/2008 |
| WO | WO 2010/011288 A1 | 1/2010 |
| WO | WO 2010/114602 A1 | 10/2010 |

OTHER PUBLICATIONS

Gaidarzhy, A., "Spectral response of a gigahertz-range nanomechanical oscillator," App. Phys. Lett. 86, 254103-1, 2005 American Inst. of Physics.

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and International Preliminary Report on Patentability for PCT/US2006/021298 mailed Nov. 6, 2006 and Dec. 6, 2012 respectively.

International Search Report and Written Opinion for International Application No. PCT/US2010/000955 mailed Jun. 23, 2010.

International Search Report and Written Opinion from corresponding International Application No. PCT/US2007/079078, mailed Jul. 3, 2008.

International Search Report and Written Opinion from corresponding International Application No. PCT/US2008/003793, mailed Jun. 16, 2008.

International Search Report and Written Opinion from International Application No. PCT/US2009/002612, mailed May 11, 2010.

International Search Report and Written Opinion from International Application No. PCT/US2011/045527 mailed Nov. 30, 2011.

Jha et al., "Thermal Isolation of Encapsulated MEMS Resonators," *J. Microelectromechanical Systems* 17(1):175-184, Feb. 2008.

Mizushima et al., "Empty-space-in-silicon technique for fabricating a silicon-on-nothing structure," Appl. Phys. Letts 77:20(3290-3292), Nov. 13, 2000.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Riley, "Introduction to Flip Chip: Why, Why, How", Oct. 2000, retrieved from http://www.flipchips.com/tutorial01.html on Mar. 26, 2010.

Tirole et al., "Lamb Waves Pressure Sensor Using an AlN/Si Structure," Proceedings Ultrasonics Symposium, Oct. 31, 1993-Nov. 3, 1993, Baltimore, MD, IEEE 1993 vol. 1, pp. 371-374.

* cited by examiner

MICROELECTROMECHANICAL SYSTEMS (MEMS) RESONATORS AND RELATED APPARATUS AND METHODS

RELATED APPLICATIONS

The present application claims the benefit under 35 U.S.C. §120 as a divisional application of U.S. patent application Ser. No. 13/466,767, filed May 8, 2012 and entitled "Microelectromechanical Systems (MEMS) Resonators and Related Apparatus and Methods."

U.S. patent application Ser. No. 13/466,767 claims the benefit under 35 U.S.C. §120 as a continuation-in-part of U.S. patent application Ser. No. 12/750,768, filed Mar. 31, 2010 and entitled "Integration of Piezoelectric Materials with Substrates". U.S. patent application Ser. No. 12/750,768 claims priority under 35 U.S.C. §119(e) to U.S. Patent Application Ser. No. 61/165,405, filed Mar. 31, 2009 and entitled "Integration of Piezoelectric Materials With Substrates".

U.S. patent application Ser. No. 13/466,767 also claims the benefit under 35 U.S.C. §120 as a continuation-in-part of U.S. patent application Ser. No. 12/781,076, filed May 17, 2010 and entitled "Methods And Apparatus For Temperature Control Of Devices And Mechanical Resonating Structures". U.S. patent application Ser. No. 12/781,076 claims priority under 35 U.S.C. §119(e) to U.S. Patent Application Ser. No. 61/184,167, filed Jun. 4, 2009 and entitled "Methods And Apparatus For Temperature Control Of Devices And Mechanical Resonating Structures".

U.S. patent application Ser. No. 13/466,767 also claims the benefit under 35 U.S.C. §120 as a continuation-in-part of U.S. patent application Ser. No. 12/899,447, filed Oct. 6, 2010 and entitled "Integration Of Piezoelectric Materials With Substrates". U.S. patent application Ser. No. 12/899,447 claims the benefit under 35 U.S.C. §120 as a continuation-in-part of U.S. patent application Ser. No. 12/750,768, filed Mar. 31, 2010 and entitled "Integration of Piezoelectric Materials with Substrates". U.S. patent application Ser. No. 12/750,768 claims priority under 35 U.S.C. §119(e) to U.S. Patent Application Ser. No. 61/165,405, filed Mar. 31, 2009 and entitled "Integration of Piezoelectric Materials With Substrates", which is hereby incorporated herein by reference in its entirety. U.S. patent application Ser. No. 12/899,447 claims priority under 35 U.S.C. §119(e) to U.S. Patent Application Ser. No. 61/368,227, filed Jul. 27, 2010 and entitled "Wafer Level Stacking Of MEMS Resonator With IC Wafer".

U.S. patent application Ser. No. 13/466,767 also claims the benefit under 35 U.S.C. §120 as a continuation-in-part of U.S. patent application Ser. No. 13/191,851, filed Jul. 27, 2011 entitled "Systems Having Integrated Mechanical Resonating Structures And Related Methods". U.S. patent application Ser. No. 13/191,851 claims priority under 35 U.S.C. §119(e) to U.S. Patent Application Ser. No. 61/368,216, filed Jul. 27, 2010 and entitled "Integrated On-Chip GPS And Inertial Navigation System;" to U.S. patent application Ser. No. 61/368,218, filed Jul. 27, 2010 and entitled "Integrated On-Chip Microelectromechanical Systems (MEMS) Radio Frequency Components In Transceivers;" to U.S. Patent Application Ser. No. 61/368,224, filed Jul. 27, 2010 and entitled "Monolithically Integrated Piezoelectric Location Awareness Device;" and to U.S. Patent Application Ser. No. 61/368,227, filed Jul. 27, 2010 and entitled "Wafer Level Stacking Of MEMS Resonator With IC Wafer".

U.S. patent application Ser. No. 13/466,767 also claims the benefit under 35 U.S.C. §120 as a continuation-in-part of U.S. patent application Ser. No. 13/247,318, filed Sep. 28, 2011 and entitled "Timing Oscillators And Related Methods". U.S. patent application Ser. No. 13/247,318 claims the benefit under 35 U.S.C. §120 as a continuation of U.S. patent application Ser. No. 12/111,535, filed Apr. 29, 2008 and entitled "Timing Oscillators And Related Methods," now U.S. Pat. No. 8,044,736 issued Oct. 25, 2011.

All of the foregoing applications and patents are hereby incorporated herein by reference in their entireties.

FIELD

The technology described herein relates to integration of piezoelectric materials with substrates.

RELATED ART

Conventional micromechanical resonators are physical structures that are designed to vibrate, often at high frequencies. Such resonators may be incorporated into a variety of devices such as timing oscillators, mass sensors, gyros, accelerometers, switches, and electromagnetic fuel sensors, amongst others.

Many conventional mechanical resonators are formed of quartz, due to the temperature-stability and high Q exhibited by the quartz crystal. Such conventional quartz resonators are individually packaged, with minimal or no electrical circuitry included within the package. Rather, connections to control circuitry are made externally to the packaged resonators.

Many of the products which utilize conventional quartz resonators (e.g., components within timing circuits, telecomm networks, toys, etc.) are frequently undergoing reductions in size, driven partially by the ongoing reductions in size of present-day silicon based integrated circuit (IC) technology. However, conventional fabrication and encapsulation methods limit packaged quartz crystal resonators to a size of about 2.5 mm×2.0 mm, making their integration with present-day products, as well as tomorrow's products of even smaller sizes, difficult.

SUMMARY

Devices including piezoelectric material structures integrated with substrates are described. Methods of fabricating such devices are also described.

According to an aspect of the present application, a packaged micromechanical resonator is provided. The packaged micromechanical resonator comprises a substrate, a cap lacking integrated circuitry, and a first portion of an electrically conductive material between the substrate and the cap, disposed such that the substrate, the cap, and the first portion of the electrically conductive material define a sealed, enclosed volume. The packaged micromechanical resonator further comprises a micromechanical resonator comprising a piezoelectric material disposed within the enclosed volume, and a second portion of the electrically conductive material between the substrate and the cap and configured to conduct a signal between the micromechanical resonator and the cap.

According to another aspect of the present application, an apparatus is provided, comprising a suspended, substantially rectangular, piezoelectric microelectromechanical systems (MEMS) resonator coupled to a first substrate. The suspended piezoelectric MEMS resonator comprises an active layer of a piezoelectric material, a multi-layered temperature compensation structure coupled to a first surface of the active layer, and a plurality of electrodes disposed adjacent a second surface of the active layer opposite the first surface. The piezoelectric MEMS resonator is configured to exhibit in-plane Lamb wave vibration in response to application of an electric field thereto by the plurality of electrodes. The apparatus further comprises a cap bonded to the MEMS resonator via a eutectic bond, the cap lacking integrated circuitry and forming a hermetic seal with the first substrate.

According to another aspect of the present application, a capped microelectromechanical systems (MEMS) resonator is provided, comprising a piezoelectric microelectromechanical systems (MEMS) resonating structure formed on a first wafer. The capped MEMS resonator further comprises a cap wafer capping the piezoelectric MEMS resonating structure, wherein the cap wafer comprises no integrated circuitry.

According to another aspect of the present application, a capped microelectromechanical systems (MEMS) resonator is provided, comprising a piezoelectric microelectromechanical systems (MEMS) resonating structure formed on a first wafer, the piezoelectric MEMS resonating structure comprising a resonating body including a piezoelectric material active layer and a layer of silicon. The capped MEMS resonator further comprises a cap wafer capping the piezoelectric MEMS resonating structure, wherein the cap wafer comprises no integrated circuitry.

According to another aspect of the present application, an apparatus is provided, comprising a first microelectromechanical systems MEMS wafer comprising a first MEMS device, and a second MEMS wafer comprising a second MEMS device. The second MEMS wafer is configured to cap the first MEMS wafer.

BRIEF DESCRIPTION OF THE DRAWINGS

Various embodiments of the technology will be described with respect to the following figures. It should be appreciated that the figures are not necessarily drawn to scale.

DETAILED DESCRIPTION

Device structures including piezoelectric materials integrated with substrates are described, as well as methods of forming the same. In some embodiments, the piezoelectric device structures include single crystal piezoelectric resonators integrated with one or more substrates, for example to form an engineered substrate. One or more of the substrates may include circuitry coupled to the piezoelectric device structures, for example to control operation of the piezoelectric device structure, and/or to detect/sense operation of the piezoelectric device structure. The piezoelectric device structures may be fabricated by bonding a wafer of piezoelectric material to a substrate wafer, and then forming the piezoelectric device structure from the wafer of piezoelectric material. In some embodiments, the piezoelectric material is quartz, which is bonded to a silicon substrate to form an engineered substrate. The piezoelectric device structure may be a quartz resonator formed from the quartz wafer.

It should be appreciated that the use of the term "coupled" herein covers both direct connection of components as well as interconnection of components through one or more intermediate components (e.g., transistors, resistors, capacitors, etc.). Also, the phrase "integrated with" as used herein refers to the interconnection of components and/or material layers such that the components/layers being interconnected form a single structure. For example, material layers (e.g., piezoelectric material layers) integrated with a substrate may form an engineered substrate.

Various aspects of the technology will now be described in greater detail. These aspects may be used alone, all together, or in any combination of two or more, as the technology is not limited in this respect.

Figure 1:
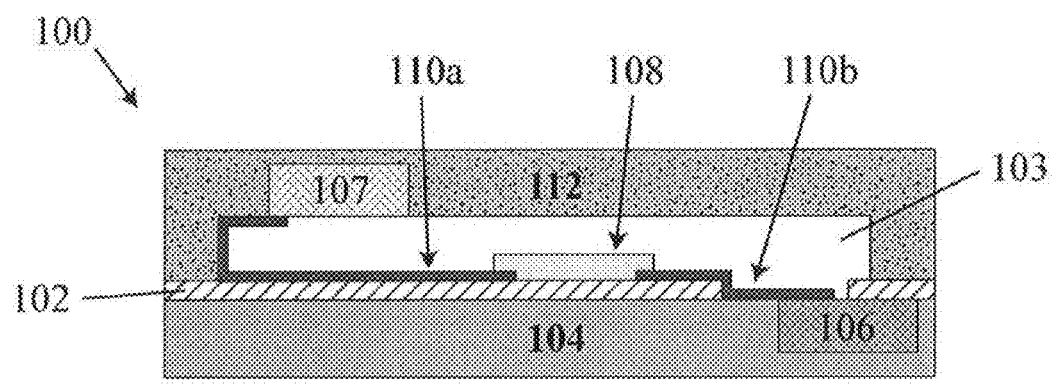
FIG. 1 illustrates a device having a piezoelectric material structure integrated with a substrate and cap, on both of which integrated circuitry is formed, according to one embodiment.

FIG. 1 illustrates a device 100 comprising a piezoelectric material structure 102 integrated with a substrate 104. Integrated circuitry 106 formed on the substrate 104 may be connected to circuitry 108 on the piezoelectric material structure 102 by interconnection 110b. A cap 112 may also be included, and may form a cavity 103. Integrated circuitry 107 may be formed on the cap 112 and connected to circuitry 108 by interconnection 110a. It should be appreciated that the integrated circuitry 106 and 107 may be any size relative to the substrate 104 and/or the cap 112, including being smaller than those structures. In some instances, the integrated circuitry may be an application specific integrated circuit (ASIC).

The piezoelectric material structure 102 may be a resonator, a filter, a sensor, or any other suitable structure, as those listed are merely non-limiting examples. Likewise, the piezoelectric material structure 102 may, in some situations, preferably comprise quartz, but may alternatively comprise $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments the piezoelectric material structure may comprise single crystal piezoelectric material (e.g., single crystal quartz), although not all embodiments are limited in this respect.

The piezoelectric material structure may be integrated with the substrate 104 by bonding a piezoelectric material wafer to the substrate 104 and then forming the piezoelectric material structure 102 from the piezoelectric material wafer. Thus, the piezoelectric material structure and the substrate 104 may form an engineered substrate. Other techniques for integrating the piezoelectric material structure may also be used, as the various aspects described herein relating to piezoelectric material structures integrated with substrates are not limited to the manner in which the two are integrated.

The substrate 104 may be formed of silicon, may comprise silicon (e.g., silicon, silicon carbide (SiC), etc.), or may be formed of any other suitable material. According to some embodiments, the substrate 104 may be formed of a semiconductor material, and in some embodiments may be formed of a single crystal semiconductor material (e.g., single crystal silicon). In some embodiments, the substrate 104 comprises a different material than that of the piezoelectric material structure 102. For example, the piezoelectric material structure may comprise single crystal quartz while the substrate 104 does not comprise quartz, e.g., the substrate may be a silicon substrate, according to one non-limiting embodiment. However, other material combinations are also possible.

The piezoelectric material structure 102 may be electrically interconnected with circuitry on the substrate 104. For example, as shown, integrated circuitry 106 (e.g., integrated silicon circuitry, CMOS circuitry, biCMOS circuitry, SiGe circuitry, GaAs circuitry, InP circuitry, etc.) may be formed on the substrate 104. The integrated circuitry may be configured to control and/or detect/sense operation of the piezoelectric material structure 102, and therefore may include compensation circuitry, synthesizer circuits, or any other suitable control and/or detection circuitry, or circuitry for any supporting functions.

The piezoelectric material structure 102 itself may include one or more electrical components (e.g., electrodes) or circuitry 108, for example to control (e.g., actuate and/or detect) the piezoelectric material structure. In the non-limiting example of FIG. 1, interconnection 110b couples the integrated circuitry 106 to the circuitry 108. The interconnection may be a conductive trace (e.g., metal traces or semiconductor traces), or may be any suitable interconnection structure. In this manner, electrical communication may take place between the piezoelectric material structure 102 and the substrate 104. Similar operation may occur between the integrated circuitry 107 on cap 112 and the circuitry 108 via interconnection 110a. As a non-limiting example, the piezoelectric material structure 102 may be a mechanical resonator (e.g., a mechanical resonator formed of single crystal quartz, or any other suitable piezoelectric material), and the integrated circuitry 106 and/or 107 may operate to actuate the resonator and/or to detect vibration of the resonator.

It should be appreciated that resonators (e.g., quartz resonators) are merely one non-limiting example of a type of piezoelectric material structure 102, and that the function of the integrated circuitry 106 and 107 may depend on the particular type of piezoelectric material structure. For example, if the piezoelectric material structure 102 is a sensor, the integrated circuitry 106 and/or 107 may operate to detect and process output signals of the sensor. Other functions of the integrated circuitry 106 and 107 are also possible. It should also be appreciated that not all embodiments include integrated circuitry on both the substrate and cap. For example, differing embodiments may include integrated circuitry on only one of the substrate and cap, on both the substrate and cap, or on neither of the substrate and cap.

In the non-limiting embodiment of FIG. 1, a cap wafer 112 is also included. The cap wafer may facilitate formation of a hermetic seal (inert or non-inert) (e.g., a vacuum seal) for the piezoelectric material structure, or may serve any other suitable function. In some embodiments, the cap wafer 112 may include circuitry 107, for example like integrated circuitry 106 on substrate 104, to communicate with the piezoelectric material structure 102 and/or the integrated circuitry 106. Similarly, in some embodiments, the cap wafer may include integrated circuitry coupled to the piezoelectric material structure, while the substrate 104 may not. It should be appreciated, however, that the cap wafer 112 is optional, and therefore not all aspects of the technology described herein implement one.

It should also be appreciated that various additional or alternative features may optionally be included in the device 100. Also, the cavity 103 may be formed in any suitable manner, and may not be included in all embodiments. For example, the cavity 103 may be formed before bonding the cap. In some embodiments, buried cavities in substrates and/or caps are formed by suitable etching of a substrate and/or cap prior to bonding to other structures (e.g., forming the cavity in the substrate prior to bonding by etching with XeF2 or SF6, or in any other suitable manner) or after bonding the cap or substrate to a wafer of piezoelectric material (e.g., by selectively etching the substrate after bonding). Alternatively, if the piezoelectric material structure 102 is to be suspended, such a result may be achieved using various alternative configurations. For example, a sacrificial layer (e.g., gold, aluminum, or any other suitable sacrificial layer) may be formed and then removed (e.g., after bonding substrate 104 to a wafer of piezoelectric material) to create an air gap between the piezoelectric material structure and the substrate 104, even though no cavity may be formed within the substrate 104 itself. Other configurations are also possible, and it should be appreciated that the various aspects described herein are not limited to use with suspended piezoelectric material structures, and when such structures are used, are not limited to suspending the structure in any particular manner.

Figure 2:
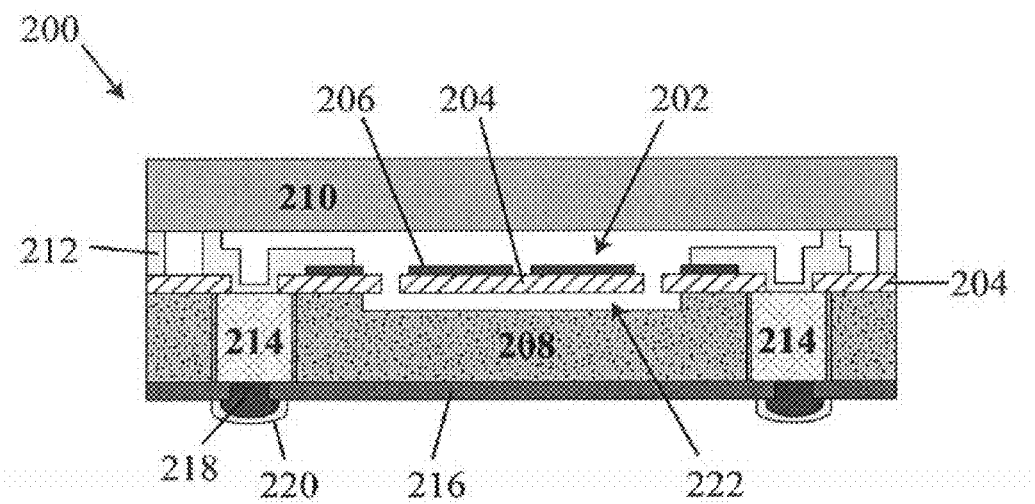
FIG. 2 illustrates a device having a piezoelectric resonator integrated with a substrate, according to one embodiment.

FIG. 2 illustrates a cross-sectional view of a non-limiting example of a device in which the piezoelectric material structure is a mechanical resonator. As shown, the device 200 comprises a mechanical resonator 202 which may be formed of a piezoelectric material 204 and may include one or more electrodes 206. The piezoelectric material 204 may comprise quartz, single crystal quartz, or any other suitable piezoelectric material (e.g., aluminum nitride (AlN), zinc oxide (ZnO), cadmium sulfide (CdS), lead titanate (PbTiO$_3$), lead zirconate titanate (PZT), lithium niobate (LiNbO$_3$), lithium tantalate (LiTaO$_3$), potassium niobate (KNbO$_3$), Li$_2$B$_4$O$_7$, langasite (La$_3$Ga$_5$SiO$_{14}$), gallium arsenside (GaAs), barium sodium niobate, bismuth germanium oxide, indium arsenide, indium antimonide, or any other non-centrosymmetric material), either in substantially pure form or in combination with one or more additional materials. It may be integrated with a substrate 208, for example by bonding, or in any other suitable manner, for example to form an engineered substrate. In the non-limiting example of FIG. 2, the substrate 208 has a cavity 222 formed therein, above which the resonator 206 is suspended. However, other configurations are also possible, as the various aspects described herein are not limited to inclusion of cavities in substrates and/or using suspended piezoelectric material structures.

The mechanical resonator 202 may be any type of mechanical resonator, such as a quartz resonator, a plate acoustic wave resonator, a flexural mode resonator, a bulk acoustic wave (BAW) resonator, a surface acoustic wave (SAW) resonator, a film bulk acoustic resonator (FBAR), or any other suitable resonator, as the various aspects described herein are not limited in this respect. Suitable resonators have been described, for example, in PCT Patent Publication No. WO 2006/083482, and in U.S. patent application Ser. No. 12/142,254, filed Jun. 19, 2008 and published as U.S. Patent Application Publication No. 2009-0243747-A1, all of which are incorporated herein by reference in their entireties. In some embodiments, the mechanical resonator may be formed of two or more materials, for example using two or more material layers. In some embodiments, the mechanical resonator may be a solidly mounted resonator (SMR), for example comprising a piezoelectric material bonded onto a stack of layers having alternating low and high acoustic impedances. Such a stack may be referred to as a mirror stack, and may be formed on a substrate.

The mechanical resonator may be actuated and/or detected in any suitable manner, including, but not limited to, being actuated and/or detected by piezoelectric techniques, electrostatic techniques, magnetic techniques, thermal techniques, piezoresistive techniques, any combination of those techniques listed, or in any other suitable manner.

In one embodiment, the mechanical resonator (and more particularly, an active layer of the mechanical resonator, such as a piezoelectric layer of a piezoelectric resonator) is configured (e.g., by suitable shaping, dimensioning, and arrangement of the components of the micromechanical resonating structure) to support Lamb waves when excited, e.g., when excited by an electric field applied across its thickness or in any other suitable direction. Lamb waves are one non-limiting example of a mode of operation which may be exhibited by mechanical resonators according to the aspects described herein. According to other embodiments, the mechanical resonator may be configured to operate in a contour mode, bulk mode, plate mode, flexural mode, any resonant mode of the following resonating structure shapes: any antenna type geometry; beams; cantilevers; free-free bridges; free-clamped bridges; clamped-clamped bridges; discs; rings; prisms; cylinders; tubes; spheres; shells; springs; polygons; diaphragms; and tori; or any other suitable mode. In some embodiments, the mechanical resonator may be substantially planar and may be configured to exhibit in-plane vibration as opposed to out-of-plane vibration.

The mechanical resonator may have any resonance frequency. For example, the frequency of the mechanical resonator may be between 1 kHz and 10 GHz. In some embodiments, the frequencies of operation of the mechanical resonator are in the upper MHz range (e.g., greater than 100 MHz), or at least 1 GHz (e.g., between 1 GHz and 10 GHz). In some embodiments, the output signal produced by the mechanical resonator may have a frequency of at least 1 MHz (e.g., 13 MHz, 26 MHz) or, in some cases, at least 32 kHz. In some embodiments, the operating frequency may range from 30 to 35 kHz, 60 to 70 kHz, 10 MHz to 1 GHz, 1 GHz to 3 GHz, 3 GHz to 10 GHz, or any other suitable frequencies.

The substrate 208 may be a semiconductor substrate (e.g., silicon, SiC, etc.), or may comprise any other suitable material, either in substantially pure form or in combination with one or more additional materials. In some embodiments, the substrate 208 may comprise single crystal material. For example, the substrate 208 may be a single crystal silicon substrate.

The device 200 further comprises a cap 210. The cap 210 may facilitate formation of a hermetic seal (creating either an inert or non-inert environment) for the resonator 202, or may serve any other suitable purpose. For example, the cap may be bonded to the substrate and/or the piezoelectric material, as described below, to form a vacuum environment for the mechanical resonator (e.g., by thermocompression, eutectic bond, or in any other suitable manner). However, not all hermetic seals necessarily result in creation of a vacuum environment. According to some non-limiting embodiments, circuitry (e.g., integrated circuitry, such as CMOS circuitry, biCMOS circuitry, InP circuitry, etc.) may be formed on the cap 210, which circuitry may be coupled to the resonator 202 (e.g., to the electrode 206 of the resonator 202) to communicate with the resonator 202. Thus, according to one non-limiting embodiment, the cap 210 may be a complementary metal oxide semiconductor (CMOS) cap, with integrated circuitry formed thereon. However, not all embodiments are limited in this respect, as, for example, in one embodiment the cap 210 may lack integrated circuitry (e.g., may be a "dummy cap"). Thus, in one embodiment, the device 200 may represent a capped MEMS device (e.g., a MEMS resonator) without integrated circuitry. In FIG. 2, the cap 210 is bonded to the substrate 208 and piezoelectric material 204 by a metallization layer 212. However, other manners of bonding the cap 210 to the other components of the device 200 may be utilized, and other types of bonding materials (e.g., other than metal) may be used.

As mentioned with respect to FIG. 1, devices comprising piezoelectric material structures integrated with substrates may be coupled to circuitry (e.g., integrated circuitry) on the substrate(s). The circuitry may control operation of the piezoelectric material structure (e.g., may actuate the piezoelectric material structure), may detect operation of the piezoelectric material structure (e.g., may detect vibration of the mechanical resonator 202), may process input and output signals sent to/from the piezoelectric material structures, or may perform any other suitable functions.

In device 200, several components provide electrical access to the mechanical resonator 202. Access may be provided to circuitry on the substrate 208, circuitry on the cap 210 (if any, since in at least one embodiment the cap 210 may lack integrated circuitry), and/or circuitry external to the device 200. For example, in addition to providing bonding, the metallization layer 212 may also provide electrical connection to the resonator 202, and in particular to the electrode 206. The metallization layer 212 may therefore provide an electrical path to circuitry on substrate 208 and/or circuitry on cap 210. According to the non-limiting embodiment of FIG. 2, electrical connection to the resonator 202 is also provided from a backside of the substrate 208, by way of two thru-silicon vias 214 (TSV). The TSVs 214 may comprise doped silicon having any suitable doping concentration to make the silicon suitably conductive, doped polysilicon with any suitable doping concentration, copper, or any other suitable conductive material. Thus, electrical signals may be sent to/from the resonator 202 by way of the TSVs, and as such, the TSVs may allow circuits external to the device 200 to communicate with the resonator 202. It should be appreciated that any number of such TSVs may be used (e.g., one, two, or many more than two), in those embodiments which utilize TSVs, and that not all embodiments include TSVs. According to some embodiments, the TSVs may function to communicate control and/or detection signals with the resonator 202. According to some embodiments, control and detection of the resonator may be substantially performed by circuits on the substrate 208 and/or cap 210, and only processed signals (e.g., output signals) may be sent external to the device 200 by the TSVs. Other communication schemes are also possible.

The device 200 illustrated in FIG. 2 further comprises additional layers 216, 218, and 220. Layer 216 may be an insulation layer (e.g., SiO2), formed in any suitable manner (e.g., deposition or growth), and etched in any suitable manner for subsequent formation of layers 218 and 220. The layers 218 and 220 may represent under-bump metallization (UBM) to provide electrical access to the mechanical resonator and/or integrated circuitry of device 200 from the backside of the substrate 208, and thus may be formed of any suitable materials and in any suitable manner. For example, the layer 218 may be electroless plated nickel and the layer 220 may be electroless plated gold, although other materials and methods of formation are also possible.

It should be appreciated that the device 200 may take any suitable dimensions, and that the various aspects of the technology described herein are not limited to devices of any particular sizes. For example, in some non-limiting embodiments, the mechanical resonator 202 may have a large dimension (e.g., length, width, diameter, circumference, etc.) of less than approximately 1000 microns, less than 100 microns, less than 50 microns, or any other suitable value. It should be appreciated that other sizes are also possible.

Figure 3:
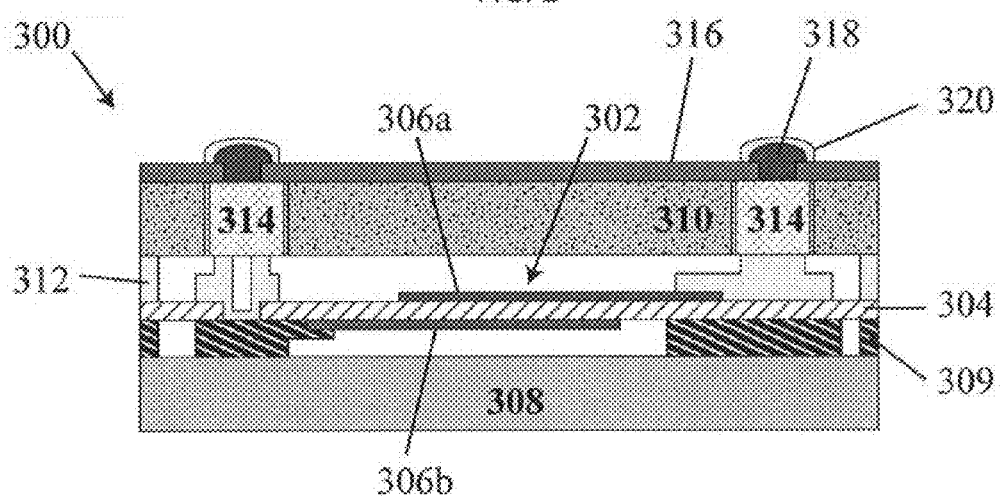
FIG. 3 illustrates an alternative device including a piezoelectric resonator integrated with a substrate, according to one embodiment.

FIG. 3 illustrates a cross-sectional view of an alternative device in which the piezoelectric material structure is a mechanical resonator. The device 300 comprises a mechanical resonator 302 comprising a piezoelectric material 304 and two electrodes; a top electrode 306a and a bottom electrode 306b. The piezoelectric material may be any suitable type of material, such as any of the materials mentioned above with respect to piezoelectric material 204 of FIG. 2. The piezoelectric material 304 is integrated with a substrate 308 by a bonding layer 309. The bonding layer may be formed of a conductive material in some embodiments (e.g., copper, or any other suitable conductive bonding material), but is not limited in this respect. As a result of the bonding layer 309, the mechanical resonator 302 is suspended above the substrate 308. Thus, in the non-limiting example of FIG. 3, no cavity is formed in the substrate 308.

The substrate 308 may be any suitable type of substrate. For example, the substrate 308 may comprise any of the materials previously described in connection with substrate 208 of FIG. 2, or any other suitable material. The substrate 308 may be a CMOS substrate, and may, in some embodiments, have circuitry formed thereon. However, in some embodiments, the substrate 308 does not have circuitry formed thereon. Any circuitry formed on substrate 308 may be coupled to the mechanical resonator 302 and may perform any suitable function (e.g., controlling operation of the mechanical resonator, detecting vibration of the mechanical resonator, any supporting functions, etc.).

The device 300 further comprises a cap 310. As with cap 210, the cap 310 may facilitate formation of a hermetic seal (e.g., a vacuum seal) for the resonator 302, or may serve any other suitable purpose, such as those described above in connection with cap 210 of FIG. 2. As will be described further below, the cap 310 may be bonded to the substrate 308 via thermocompression, eutectic bond, or in any other suitable manner. According to one non-limiting embodiment, the cap 310 may be a complementary metal oxide semiconductor (CMOS) cap, with integrated circuitry formed thereon. However, not all embodiments are limited in this respect, as, for example, according to one embodiment the cap 310 may lack integrated circuitry, or any active circuitry at all. In one such embodiment, then, it should be appreciated that the cap may be relatively simple, comprising nothing more than the cap material and thru vias 314 (e.g., thru-silicon vias). The thru vias may allow for electrical signals to be provided to/from the external environment from/to the resonator 302. In some such embodiments in which the cap does not include active circuitry (e.g., active integrated circuitry), placement of the thru vias on the cap 310 as opposed to on the substrate 308 may be beneficial despite the increased electrical path length which may be achieved if the thru vias were placed on the substrate 308. For instance, the manufacturing of the device 300 may be simplified in such embodiments even though the manufacturing of the cap 310 may be made more complicated (compared to if the cap 310 lacked the thru vias).

In FIG. 3, the cap 310 is bonded to the piezoelectric material 304 by a metallization layer 312. However, other manners of bonding the cap 310 to the other components of the device 300 may be utilized, and other types of bonding materials (e.g., other than metal) may be used.

As mentioned with respect to FIGS. 1 and 2, devices comprising piezoelectric material structures integrated with substrates may be coupled to circuitry (e.g., integrated circuitry) on one or more of the substrate(s). In device 300, several components allow electrical connection to the mechanical resonator 302, and in particular to the top electrode 306a and bottom electrode 306b. For example, in addition to facilitating bonding, the metallization layer 312 is configured to provide electrical connection to the resonator 302. In the non-limiting embodiment of FIG. 3, electrical connection to the resonator 302 is provided from a backside of the cap 310, by way of two thru-silicon vias 314 (TSV). The TSVs 314 may be formed of any suitable materials, such as any of those previously described with respect to TSVs 214, or any other suitable material. The TSVs 314 may perform any of the functions previously described with respect to TSVs 214. It should be appreciated that any number of such TSVs may be used.

The device 300 illustrated in FIG. 2 further comprises additional layers 316, 318, and 320, which may be identical to, or similar to, layers 216, 218, and 220 of device 200. Thus, the layer 316 may be an insulation layer formed in any suitable manner. Layers 318 and 320 may be electroless plated nickel and gold, respectively, or may be any other suitable materials. Thus, the layers 318 and 320 may provide electrical connection to the mechanical resonator 302.

As with device 200 in FIG. 2, it should be appreciated that the device 300 may take any suitable dimensions, such as any of the dimensions listed with respect to device 200, or any other suitable dimensions.

Thus, it should be appreciated that in the embodiments of FIGS. 2 and 3, the device may include a capped MEMS structure (e.g., a MEMS resonator, as a non-limiting example, though other structures such as MEMS pressure sensors, MEMS microphones, MEMS accelerometers, MEMS gyroscopes, etc. may be implemented), in which the cap includes or lacks integrated circuitry. In either scenario, the cap may be bonded to the substrate on which the MEMS device is located via a conductive bond (e.g., a conductive metal used as a bonding and/or seal ring material), though not all embodiments require a conductive capability between the cap and the MEMS structure. For example, if the cap is a dummy cap, lacking any circuitry at all, and if external access to the MEMS structure is provided via the substrate on which the MEMS structure is formed, then electrical connection between the cap and the MEMS structure may not be implemented, in a non-limiting embodiment.

It should be further appreciated from the foregoing discussion that the cap in various embodiments described herein may include circuitry, but no active circuitry, for example including only resistors, capacitors, inductors, etc. Further non-limiting examples are described below.

It should be appreciated that the caps (e.g., caps 210 and 310) may be formed of any suitable material. Non-limiting examples include semiconductor materials (e.g., silicon, a silicon-based material, a material comprising silicon, or any other suitable semiconductor), insulating materials (e.g., glass, ceramic, or other suitable insulating material) or a conductive material. The material may be selected to provide a desired thermal expansion coefficient. If the cap is to include thru vias (e.g., TSVs 314) it may be desirable to choose a cap material having high resistance (e.g., glass, ceramic, etc.), which may minimize or eliminate cross-talk between the TSVs.

As should be further appreciated from the foregoing description, devices according to one or more aspects described herein may include thinned substrates and/or thinned caps. Referring to FIG. 3 as a non-limiting example, the substrate 308 and/or the cap 310 may be thinned, though neither is necessarily thinned and in some embodiments neither one is thinned (e.g., the substrate and/or cap may be non-thinned). As a further example, the cap 310 may be thinned to facilitate formation of the TSVs 314 therein. If the substrate and/or cap are thinned, the thinned dimension may take any suitable value, as the various aspects described herein are not limited in this respect.

Devices having piezoelectric material structures integrated with substrates may be fabricated in any suitable manner, and the various devices described herein are not limited to being fabricated in any particular manner. According to one aspect of the technology described, fabrication techniques enabling wafer-level processing (as opposed to separate fabrication of individual devices) are provided. The wafer-level processing may utilize one or more steps available in silicon processing and microelectromechanical systems (MEMS) processing schemes, and in some embodiments all steps of fabrication may be performed using conventional silicon processing techniques. In those situations in which wafer-level processing is performed, individual devices may be produced by dicing the processed wafers, though it should be appreciated that not all embodiments are limited in this respect.

Figure 4:
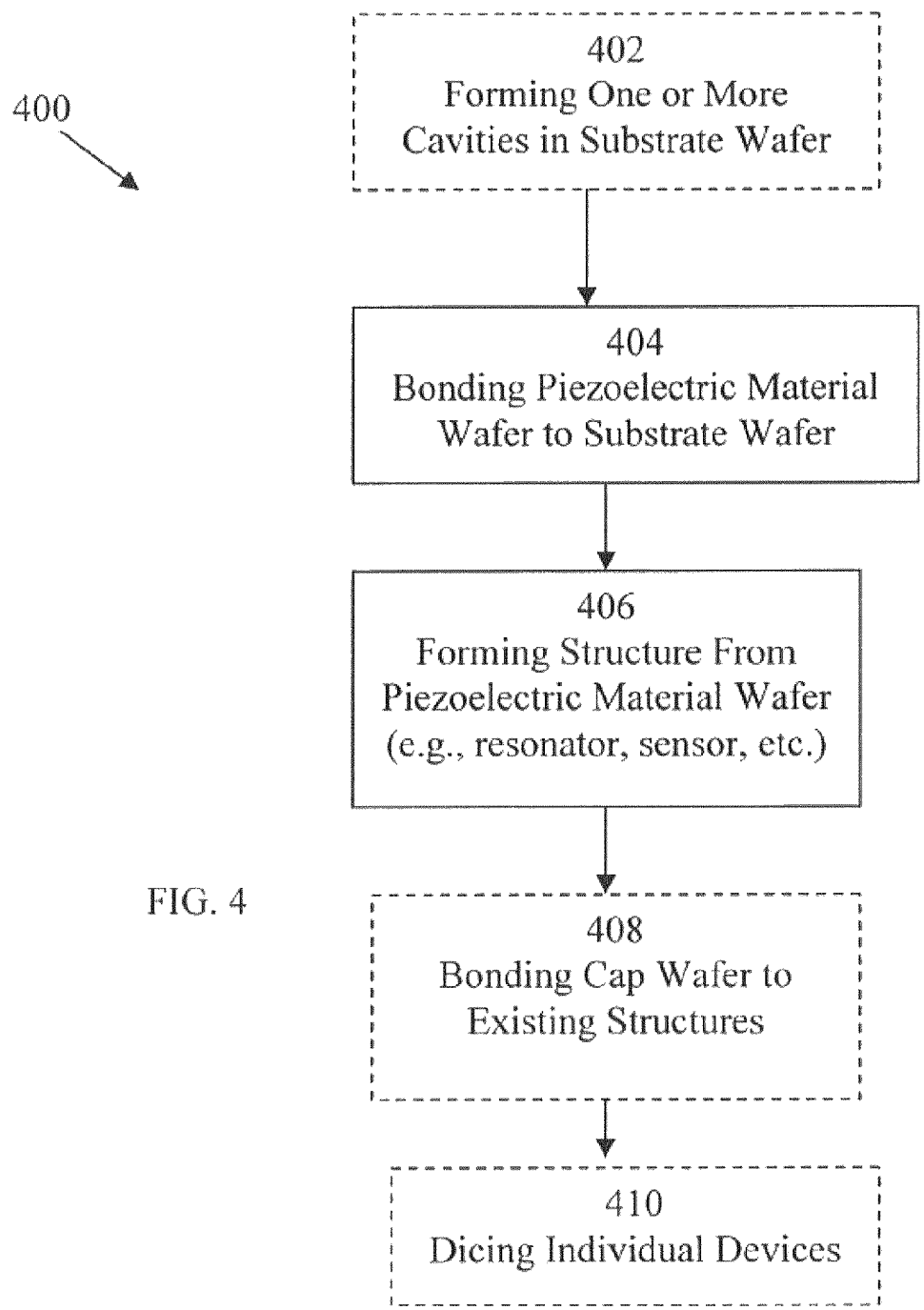
FIG. 4 is a flowchart illustrating a fabrication routine for forming piezoelectric material structures integrated with substrates, according to one embodiment.

Referring to FIG. 4, a non-limiting example of a processing sequence for wafer-level processing of devices, like devices 100, 200, and 300, is shown. Those steps which are optional are shown in boxes with a dashed outline.

The method 400 may begin at 402 by forming one or more cavities in a substrate wafer. For example, as seen with respect to FIG. 2, a device 200 may include a cavity 222. Thus, for wafer-level processing of such devices, cavities 222 may be formed in a suitable substrate. However, as has been seen with respect to device 300 in FIG. 3, not all embodiments of devices described herein include cavities within a substrate. In addition, it should be appreciated that the techniques described herein apply to devices in which a piezoelectric material structure is not suspended at all (e.g., a multi-layered surface acoustic wave device, or other devices not requiring a suspended structure). Thus, the formation of cavities at 402 is optional.

The method 400 continues at 404 by bonding a piezoelectric material wafer to a substrate wafer (e.g., the substrate wafer from 402 if step 402 is performed). The piezoelectric material wafer (e.g., a wafer of single crystal quartz, in one non-limiting embodiment) may have polished surfaces in some embodiments, and may be bonded to the substrate wafer (e.g., a silicon wafer) using any suitable bonding technique. If step 402 has previously been performed, then the bonding at step 404 may result in a plurality of buried cavities.

It should also be appreciated that one or more structures may be formed on the piezoelectric material wafer and/or the substrate wafer prior to bonding of the two. For example, electrodes may be formed on the piezoelectric material wafer prior to the bonding. However, not all embodiments are limited in this respect.

Subsequently, at 406, a piezoelectric material structure (e.g., mechanical resonators 202 and 302) may be formed from the piezoelectric material wafer. The formation of such structures may involve sub-steps such as depositing, patterning, and/or etching of materials, or any suitable combination of such processing steps. Which sub-steps are employed to form the piezoelectric material structure at 406 may depend on the type of structure being formed (e.g., filters, resonators, sensors, etc.).

The formation of a piezoelectric material structure integrated with a substrate may thus be completed at step 406. However, according to some embodiments, devices, such as devices 200 and 300, further comprise cap wafers. Thus, at 408, bonding of a cap wafer to the existing structures (e.g., to the substrate wafer, piezoelectric material wafer, etc.) may optionally be performed. One alternative to using a cap wafer is to deposit a thin film capping layer. Other alternatives are also possible, and according to some embodiments no form of cap is used.

According to one embodiment, the steps of method 400 described thus far may be utilized to form a single device. However, as previously mentioned, according to another embodiment the method 400 may be utilized to perform wafer-level processing resulting in the formation of multiple devices. In such an embodiment, then, the method 400 may optionally include, at 410, dicing the processed wafers to form individual devices. According to some embodiments in which dicing may be employed, the dicing may expose bond pads which may be used, for example, for wirebonding to other integrated circuits. In such embodiments, TSVs may not be included in the device, although diced devices are not limited in this respect.

The devices 200 and 300 of FIGS. 2 and 3 may be fabricated by any suitable processing sequence, and are not limited to being fabricated in any particular manner. For purposes of illustration, one non-limiting example of a processing sequence for forming device 200 is now described in connection with FIGS. 5A-5J. It should be appreciated that the illustrated processing sequence represents a specific, non-limiting implementation of method 400. Furthermore, while FIGS. 5A-5J illustrate the fabrication of a single device, it should be appreciated that the processing steps illustrated may be performed at a wafer level, such that multiple devices may be fabricated at the same time.

Figure 5A:
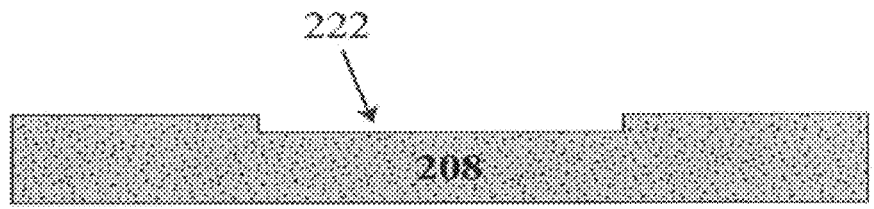
FIGS. 5A-5J illustrate a process sequence for fabricating the device of FIG. 2, according to one embodiment.

Referring to FIG. 5A, the process may begin by forming the cavity 222 in the substrate 208. It should also be appreciated that the substrate 208 may have one or more layers formed thereon, such as an oxide layer or any other suitable layers, which are not shown in FIGS. 5A-5J since such additional layers are optional and are not part of the non-limiting example of FIGS. 5A-5J. In addition, as previously mentioned, in some embodiments the substrate 208 may have integrated circuitry formed thereon. Such integrated circuitry may be formed at any suitable stage of the processing, such as prior to the formation of the cavity 222, or at any other suitable stage of processing.

Figure 5B:
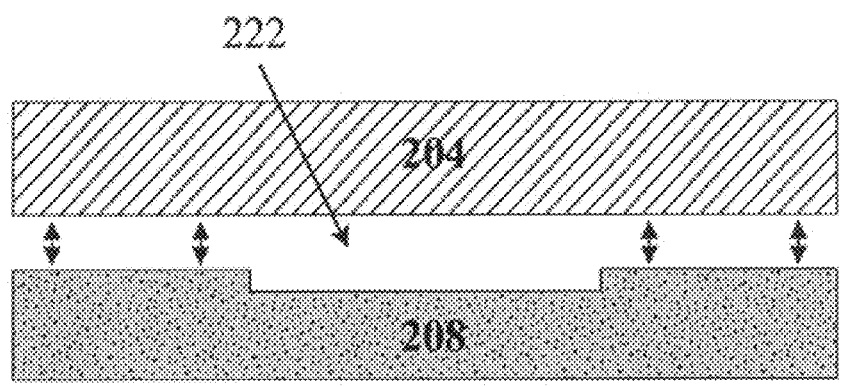

In FIG. 5B, a wafer of piezoelectric material 204 may be bonded to the substrate 208. The bonding of the substrate 208 and the wafer of piezoelectric material 204 may be accomplished by low temperature wafer bonding, or in any suitable manner. In addition, the surfaces of the wafer of piezoelectric material 204 may be polished in some embodiments, either prior to bonding to the substrate 208 or subsequent to the bonding.

As previously mentioned with respect to FIG. 2, some devices according to the aspects described herein may include metal layers (for example, metal traces) designed to align with the cavity 222. Such metal layers may be formed on the substrate 208 and/or on the wafer of piezoelectric material 204. If included, such metal layers may be formed prior to bonding of the substrate 208 with the wafer of piezoelectric material 204. However, such metal layers are optional, and are not included in the non-limiting example of FIGS. 5A-5J.

Figure 5C:
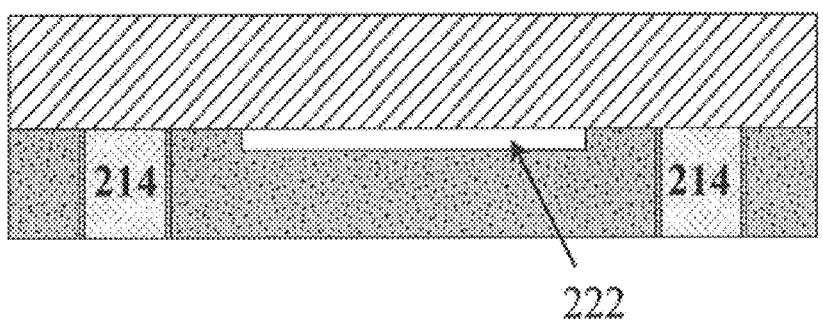

As previously mentioned with respect to FIG. 2, electrical connection to the resonator 202 (not yet formed) may be provided from a backside of the substrate 208. Thus, as shown in FIG. 5C, the substrate 208 may be thinned and TSVs 214 may be formed in the substrate 208. The thinning of the substrate 208 may be accomplished in any suitable manner, and the thinned thickness of the substrate may take any suitable value. For example, the substrate 208 may have a thickness between approximately 400-700 microns, or any other suitable thickness, prior to thinning, and between approximately 300-400 microns, or any other suitable thickness, after thinning. The TSVs 214 may be formed of a conducting material.

It should also be appreciated with respect to FIG. 5C that the cavity 222 becomes a buried cavity when the substrate 208 is bonded to the wafer of piezoelectric material 204.

Figure 5D:
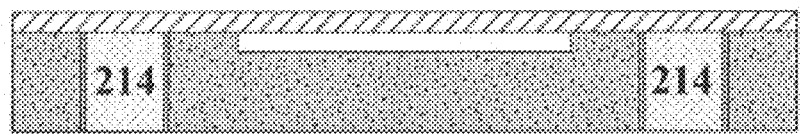

As previously shown with respect to FIG. 2, the device 200 includes a resonator 202 formed by the piezoelectric material 204 and an electrode. According to some embodiments, the resonator may have a thickness less than that of the wafer of piezoelectric material 204 bonded to the substrate 208 in FIG. 5B. Therefore, as shown in FIG. 5D, the wafer of piezoelectric material 204 may be thinned to any suitable thickness. For example, the wafer of piezoelectric material may have a thickness between approximately 350-550 microns, or any other suitable thickness, prior to thinning, and less than approximately 50 microns (e.g., 10 microns, 20 microns, or 30 microns), or any other suitable thickness, after thinning. The thinned thickness may depend on the type of piezoelectric material structure formed (e.g., resonator, filter, sensor, etc.) and the mode and frequency of operation of the structure. For example, for a resonator intended to have a resonant frequency of approximately 100 MHz, the piezoelectric material may be thinned to a final thickness of approximately 16 microns. For a resonator intended to have a resonant frequency of approximately 1 GHz, the piezoelectric material may be thinned to a thickness of approximately 1.6 microns. The thinning may be performed by lapping/grinding and/or chemical etching, or in any other suitable manner. After the thinning is completed, an optional step may be performed to smooth the exposed surface of the piezoelectric material 204, for example by chemical-mechanical polishing (CMP), or in any other suitable manner.

Figure 5E:
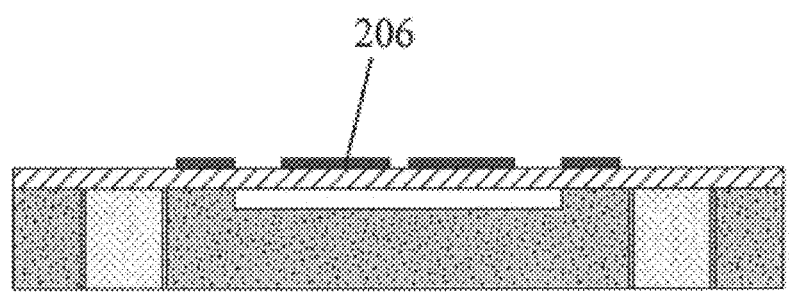

Subsequently, as shown in FIG. 5E, the electrode 206 may be formed by depositing a suitable conducting material and then patterning the material.

Figure 5F:
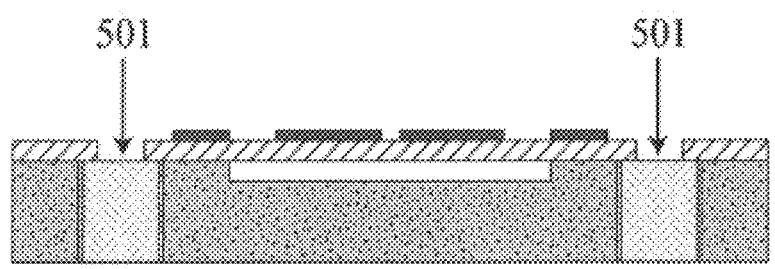

As previously mentioned, electrical connection may be provided to the resonator 202 (not yet formed in FIG. 5E) by way of the TSVs 214 previously formed. Thus, as shown in FIG. 5F, the piezoelectric material 204 may be patterned to form openings 501, to provide interconnection between the TSVs 214 and the electrode 206. The patterning and etching used to form openings 501 may be performed in any suitable manner, as the various aspects described herein are not limited in this respect.

Figure 5G:
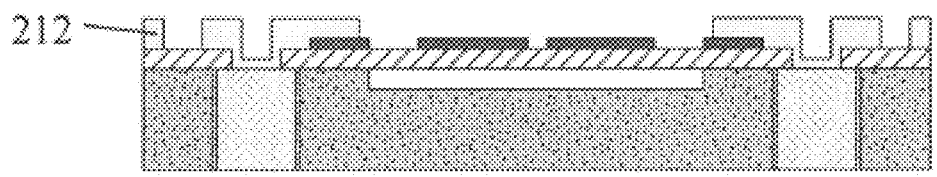

Subsequently, as shown in FIG. 5G, the metallization layer 212 may be deposited and patterned to provide interconnection between the TSVs 214 and the electrode 206, as well as to serve as a seal ring for subsequent bonding of the cap wafer.

Figure 5H:
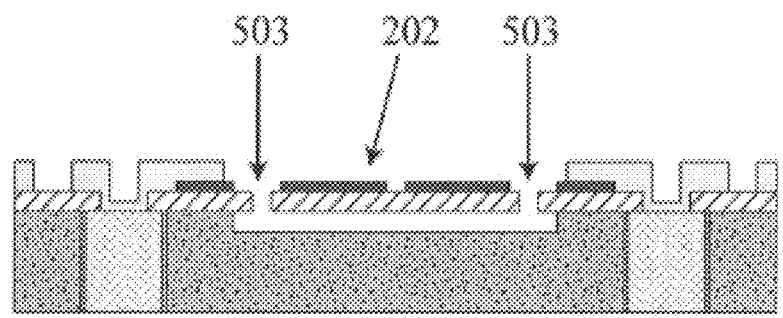

As shown in FIG. 5H, the piezoelectric material 204 may then be etched to suspend the resonator 202 above the cavity 222. Thus, in the cross-section illustrated in FIG. 5H, openings 503 may be formed by the etching process. It should be appreciated that one or more anchor elements may be formed by the etching process of the single crystal piezoelectric material wafer 204, which anchor elements may support the resonator 202, and which are not shown in FIG. 5H. It should be appreciated that the etching of FIG. 5H is optional. For example, such etching may not be performed depending on the type of piezoelectric material structure formed (e.g., a resonator, a filter, a sensor, etc.) and/or the mode of operation of the piezoelectric material structure (e.g., the mode of the resonator may not require the etching of FIG. 5H to be performed). However, for some types of structures and modes of operations (e.g., plate acoustic wave resonators, resonators operated in a flexural mode, etc.) etching may enhance operation of the structure. Thus, the etching may optionally be performed.

Figure 5I:
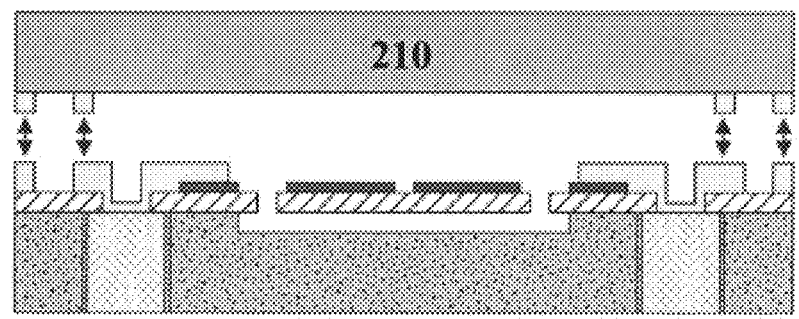

Subsequently, as shown in FIG. 5I, the cap 210 may be bonded to the metallization layer 212, and may serve any of various functions. The bonding may be performed using glass frit, metal thermocompression (e.g., Au—Au), metal eutectic techniques (e.g., Au/Sn, Al/Ge, etc.), or any other suitable techniques. As mentioned, in some embodiments the cap may include integrated circuitry formed thereon, which circuitry may be formed prior to the bonding illustrated in FIG. 5I, or after such bonding. For example, according to some embodiments, the cap may include integrated circuitry while the substrate may not, or vice versa. Alternatively, both may include integrated circuitry, as the various aspects are not limited in this respect.

Figure 5J:
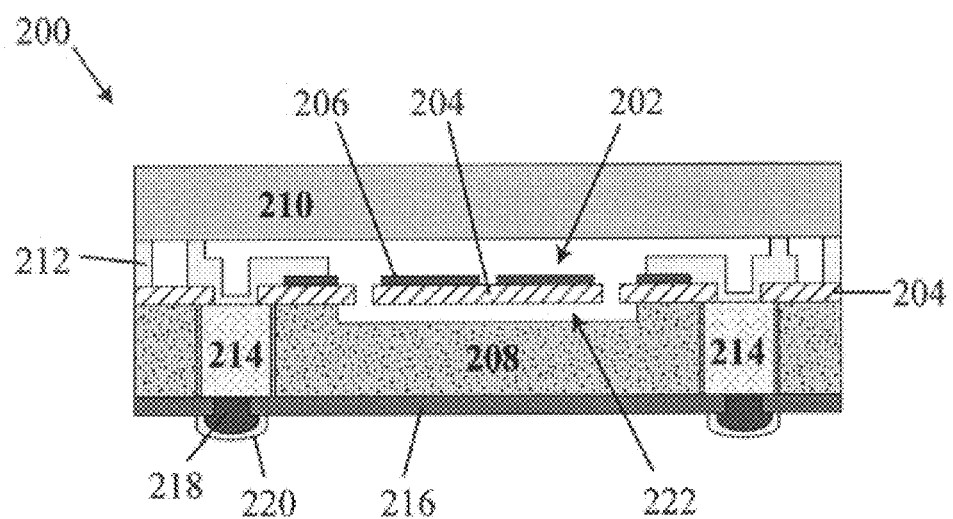

According to some embodiments, the device 200 may be configured to be surface mountable. In such embodiments, under-bump metallization may be used to facilitate bonding and/or electrical connection of the device 200. Thus, as shown in FIG. 5J, the additional layers 216, 218, and 220 may be added to complete the device 200. For example, layer 216 may be formed by deposition, growth, or any other suitable technique. Layers 218 and 220 may be formed by electroless plating, or in any other suitable manner.

As mentioned, the structures illustrated in FIG. 2, and FIGS. 5A-5J may represent only a single device formed during wafer-level processing, such that additional devices may simultaneously be fabricated on the wafers. Therefore, subsequent to the fabrication shown in FIG. 5J, a dicing step may be performed to separate individual devices 200.

FIGS. 6A-6H illustrate one non-limiting process by which the device 300 of FIG. 3 may be fabricated. As with the processing illustrated in FIGS. 5A-5J, the processing illustrated in FIGS. 6A-6H conforms to the general sequence illustrated by method 400 in FIG. 4.

Figure 6A:
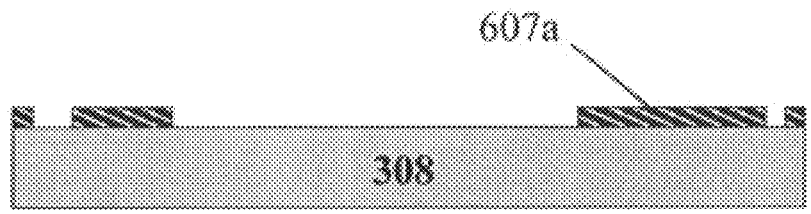
FIGS. 6A-6H illustrate a process sequence for fabricating the device of FIG. 3, according to one embodiment.

As shown in FIG. 6A, the fabrication may begin by depositing and patterning a bonding layer 607a on the substrate 308. As previously explained, the device 300 comprises a bonding layer 309, which in the non-limiting example of FIGS. 6A-6H is formed by two individual bonding layers, 607a and 607b (shown in FIG. 6B). As previously mentioned with respect to FIG. 3, the substrate 308 may be a silicon CMOS substrate, and the bonding layer 607a, which again may be one of two layers used to form the bonding layer 309, may be conductive (e.g., copper) according to some embodiments. The bonding layer 607a may be patterned in any suitable manner.

Figure 6B:
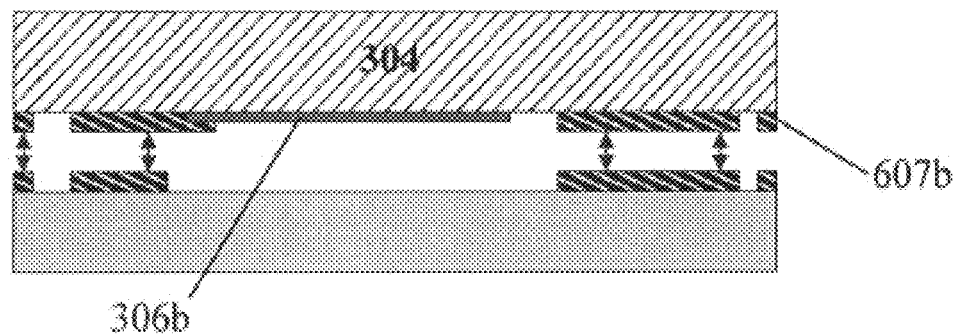

Subsequently, as illustrated in FIG. 6B a wafer of piezoelectric material 304 may be bonded to the substrate 308. The bonding of substrate 308 with the wafer of piezoelectric material 304 may be accomplished with low temperature wafer bonding, or in any other suitable manner, as it should be appreciated that the device 300 is not limited to being fabricated in any particular manner. The substrate 308 may then optionally be thinned, for example to provide an overall chip height below a desired value. However, thinning of the substrate 308 is not performed in the non-limiting sequence of FIGS. 6A-6H.

Prior to the bonding of substrate 308 to the wafer of piezoelectric material 304, the bottom electrode 306b may be formed on the wafer of piezoelectric material 304. In addition, FIG. 6B illustrates that in this non-limiting fabrication example, the wafer of piezoelectric material 304 includes a bonding layer 607b, which may be formed of the same material as bonding layer 607a, or of any other suitable material. It should also be appreciated that in some embodiments the wafer of piezoelectric material 304 has polished surfaces, which may be polished in any suitable manner.

As mentioned with respect to FIG. 3, the device 300 may include a resonator 302, formed at least in part by the piezoelectric material 304. According to some embodiments, the desired thickness of the piezoelectric material 304 for purposes of the resonator 302 is less than the thickness of the wafer of piezoelectric material illustrated in FIG. 6B. Therefore, in FIG. 6C, the wafer of piezoelectric material 304 is thinned by lapping/grinding and/or chemical etching, or in any other suitable manner. For example, the wafer of piezoelectric material may have a thickness between approximately 350-550 microns, or any other suitable thickness, prior to thinning, and less than approximately 50 microns (e.g., 10 microns, 20 microns, or 30 microns), or any other suitable thickness, after thinning. The thinned thickness may depend on the type of piezoelectric material structure formed (e.g., resonator, filter, sensor, etc.) and the mode and frequency of operation of the structure. After the thinning is completed, CMP may be performed to produce a smooth surface on the wafer of piezoelectric material 304.

Figure 6C:
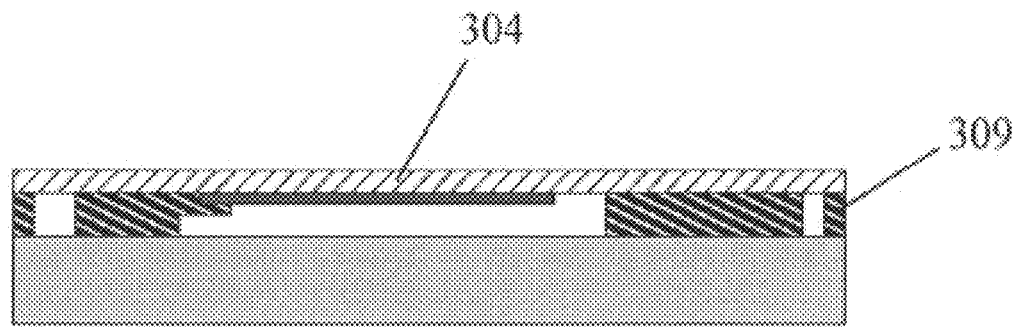

It should be appreciated by reference to FIG. 6C that the bonding layer 309 is formed by the combination of bonding layers 607a and 607b. It should further be appreciated that in some embodiments a single bonding layer may be used, rather than combining multiple bonding layers in the manner shown in FIG. 6B.

Figure 6D:
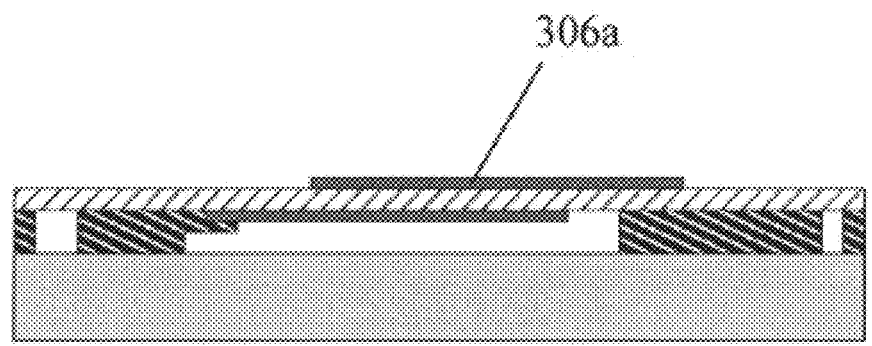

As seen in reference to FIG. 3, the resonator 302 includes a top electrode 306a, which may be formed in FIG. 6D. For example, the top electrode 306a may be formed by depositing and patterning a metal layer.

Figure 6E:
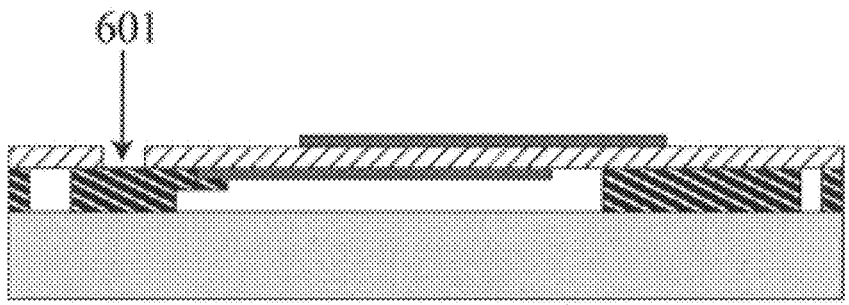
Figure 6F:
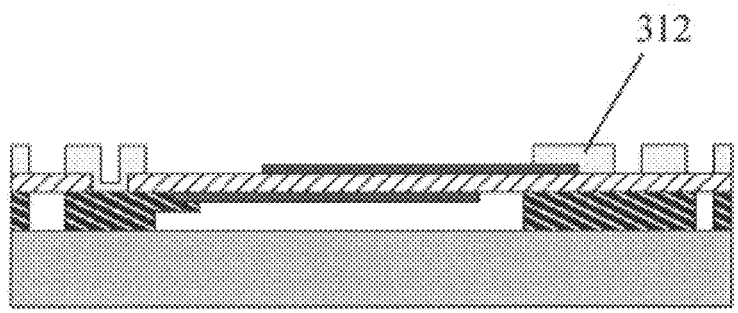

Referring again to FIG. 3, the device 300 provides electrical connection to the bottom electrode 306b by way of the TSV 314. Accordingly, as shown in FIG. 6E, the piezoelectric material 304 may be patterned and etched in any suitable manner to form the opening 601. Then, as shown in FIG. 6F, the metallization layer 312 may be formed. As previously described with respect to FIG. 3, the metallization layer 312 may serve multiple purposes, such as forming a seal ring and/or functioning as a conductive interconnection for the TSVs.

Figure 6G:
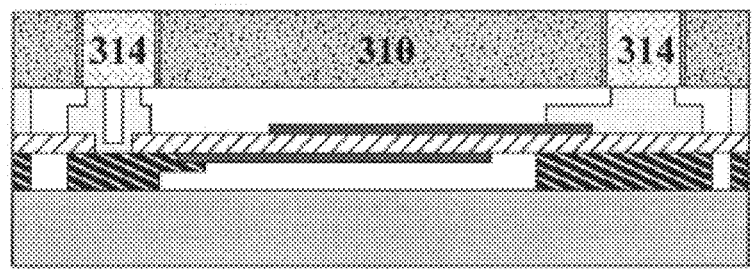

Subsequently, as shown in FIG. 6G, the cap 310, which may have the TSVs 314 already formed therein, may be bonded to the piezoelectric material 304 by the metallization layer 312. According to some embodiments, such bonding may create a high vacuum environment, although not all embodiments are limited in this respect. Also, it should be appreciated that in an alternative embodiment the TSVs 314 may be formed after the cap 310 is bonded to the metallization layer 312.

Figure 6H:
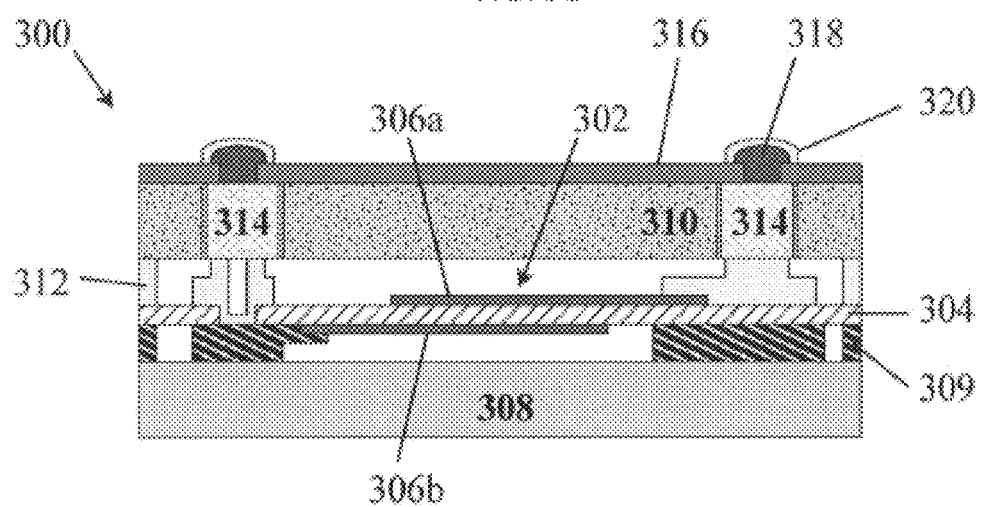

Subsequently, as shown in FIG. 6H, the device 300 may be completed by the formation of additional layers 316 (e.g., by deposition (e.g., CVD or PVD)), 318 (e.g., by electroless plating), and 320 (e.g., by electroless plating), previously described with respect to FIG. 3.

As noted above with respect to FIGS. 1 and 2, the devices described herein can comprise a cap, which can, for example, facilitate the formation of a seal. The seal may be used to encapsulate a device (e.g., a MEMS device, such as a MEMS resonator), which may facilitate operation of the device, prevent contamination of the device, or perform various other beneficial functions. In some embodiments, a device formed on a first substrate or wafer may be capped with a CMOS cap having circuitry (e.g., silicon circuitry) for controlling (e.g., driving and/or sensing) operation of the device. According to one non-limiting embodiment, the first wafer includes a MEMS resonator having a micromechanical resonating structure (e.g., a piezoelectric resonating structure), and the first wafer is capped with a CMOS cap including circuitry suitable for controlling operation of the MEMS resonator.

Figure 7A:
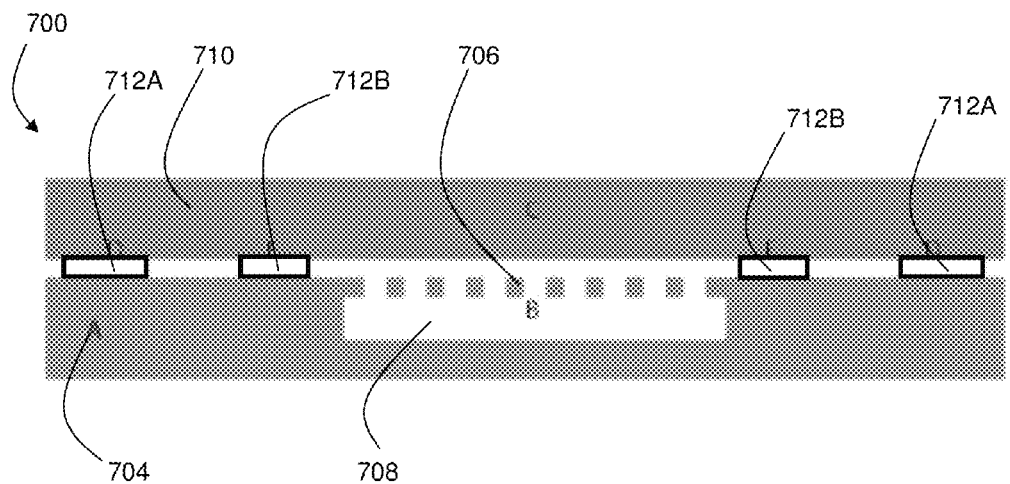
FIGS. 7A-7B illustrate a device having a resonator, a substrate, a cap, and an electrically conductive material, according to one embodiment.
Figure 7B:
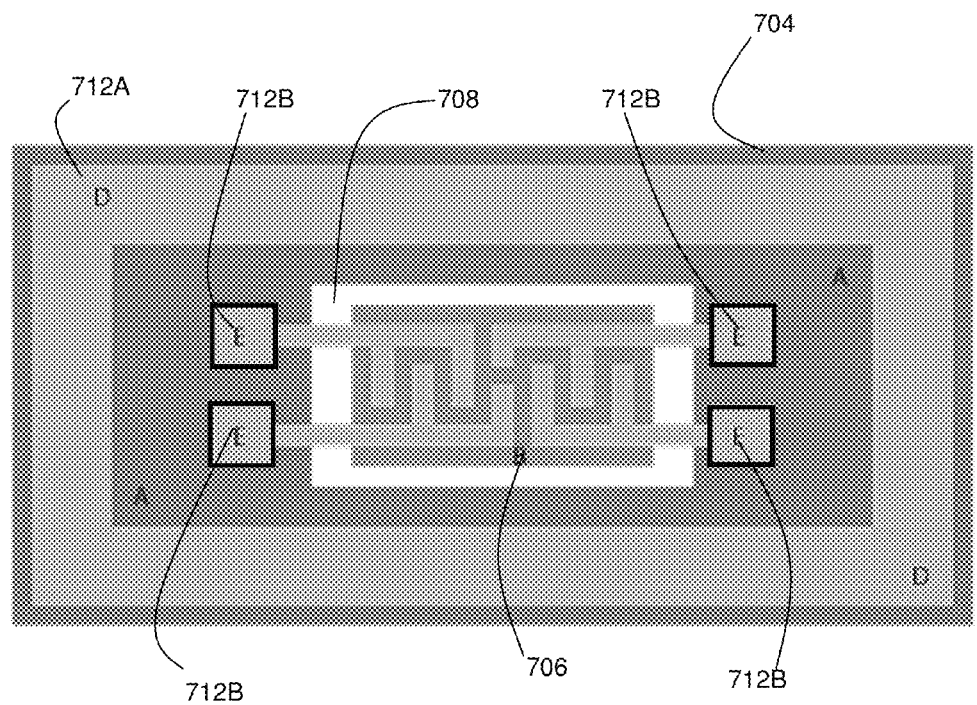

According to at least some of those aspects described herein in which a substrate or wafer including a device (e.g., a device wafer or a device substrate) is capped (e.g., with a CMOS cap including CMOS circuitry), the cap and wafer/substrate may be bonded in any suitable manner, including by use of a bonding material that is electrically and/or thermally conductive (e.g., metallization layer 212 in FIG. 2 and metallization layer 312 in FIG. 3 may be electrically and/or thermally conductive). Suitable bonding with such a material may be used to facilitate the formation of the seal between the substrate and the cap. FIGS. 7A-7B include schematic illustrations of a non-limiting exemplary device 700 in which a seal is formed between substrate 704 and cap 710. FIG. 7A includes a cross-sectional schematic illustration of device 700 while FIG. 7B includes a top-view schematic of device 700.

In FIGS. 7A-7B, the substrate 704 may include a device 706 (e.g., a piezoelectric device), such as a MEMS resonator or any other device of interest. The cap 710 may be a CMOS cap including CMOS circuitry (not shown) suitable for controlling (e.g., driving and/or sensing) operation of the device of substrate 704, though not all embodiments are limited in this respect, as for example the cap 710 may lack integrated circuitry, active circuitry, or any circuitry at all in some embodiments. In the set of embodiments illustrated in FIGS. 7A-7B, a first portion of electrically conductive material 712A and a second portion of electrically conductive material 712B are positioned between substrate 704 and cap 710. In some embodiments, the electrically conductive material can be modified to produce the seal between the substrate and the cap. For example, a seal between the substrate and the cap can be produced by heating the electrically conductive material (e.g., above the melting point of the electrically conductive material, above the soldering temperature of the electrically conductive material). By sealing the substrate to the cap in this way, a packaged device (e.g., a packaged resonator) can be produced in which the device (e.g., resonator) is housed within a sealed volume. For example, in FIGS. 7A-7B, device 706 is sealed within volume 708 by first portion 712A.

As noted elsewhere herein, a seal can be formed between the substrate and the cap, optionally using the electrically and/or thermally conductive material. In some embodiments, the electrically and/or thermally conductive material can be used to form a hermetic seal between the substrate and cap. In some cases, the electrically and/or thermally conductive material can be used to create a controlled atmosphere around the resonator. For example, the electrically and/or thermally conductive material may be used to seal a gas (e.g., an inert or non-inert gas) within a cavity between the substrate and the cap. The electrically and/or thermally conductive material can also be used to form a vacuum seal between the substrate and cap. For example, in some embodiments, the absolute pressure within a cavity formed by sealing the substrate to the cap (e.g., using the electrically conductive material) can be less than about 0.5 bar, less than about 0.1 bar, less than about 0.01 bar, less than about 10-3 bar, less than about 10-5 bar, less than about 10-7 bar, less than about 10-10 bar, between about 10-12 bar and about 0.5 bar, between about 10-12 bar and about 0.1 bar, between about 10-12 bar and about 0.01 bar, between about 10-12 bar and about 10-3 bar, between about 10-12 bar and about 10-5 bar, between about 10-12 bar and about 10-7 bar, or between about 10-12 bar and about 10-10 bar.

The electrically and/or thermally conductive material can be formed on the substrate, the cap, or both the substrate and cap prior to being modified to produce the seal between the cap and the substrate. In the set of embodiments illustrated in FIG. 7B, material 712A and/or 712B is formed on substrate 704. The electrically conductive material can be formed on the substrate and/or cap using any suitable method. For example, the material 712A and/or 712B can be printed onto a substrate and/or a cap (e.g., in the case of a printed metal or polymer paste). In some embodiments, the material 712A and/or 712B can be sputtered onto a substrate and/or a cap. The material 712A and/or 712B can also be evaporated onto a substrate and/or a cap. In still other embodiments, the material 712A and/or 712B can be deposited via electroplating or electroless plating. In some embodiments, a eutectic bond may be desired, with one of the two eutectic pair materials being formed on the cap and the other material being formed on the substrate. As a non-limiting example, an aluminum-germanium eutectic bond may be formed by depositing aluminum on one of the structure (e.g., on the substrate) and the germanium on the other structure (e.g., the cap) and then bonding the two together.

Any suitable dimensions of the material 712A and/or 712B may be chosen to achieve the functionality described herein. For example, in some embodiments the dimensions (e.g., thickness, width, etc.) may be chosen to ensure the material 712A and/or 712B (e.g., continuous material portion 712A) forms a suitable seal between the substrate and the cap. In some embodiments, the dimensions may be chosen to ensure the material 712A and/or 712B provides desired electrical and/or thermal properties. In some embodiments, the material 712A and/or 712B may be relatively thick. The use of thick bonding layers (e.g., thick layers of material 712A and/or 712B) may be advantageous because, in some cases, variations in the thickness of relatively thick bonding layers may have a relatively small effect on the quality of the seal produced by the layer. For example, in some embodiments, a seal can be formed by heating the material portion 712A, during which the material can reflow. When a relatively thick bonding material layer is used, more bonding material (e.g., material portion 712A) is available to fill voids between the substrate and the cap during the reflow process, thereby producing a relatively good seal. In some embodiments, the average thickness of the material 712A and/or 712B can be at least about 0.1 microns, at least about 0.5 microns, at least about 1 micron, at least about 5 microns, at least about 10 microns, at least about 50 microns, between about 0.1 microns and about 100 microns, between about 0.5 microns and 10 microns, between about 1 micron and about 100 microns, between about 5 microns and about 100 microns, between about 10 microns and about 100 microns, or between about 50 microns and 100 microns. Other dimensions are also possible, as the various aspects described herein relating to the use of electrically and/or thermally conductive bonding materials are not limited in this respect.

The material 712A and/or 712B can have a variety of suitable shapes. In some embodiments, the material 712A and/or 712B can circumscribe the device 706 (e.g., a resonator) and/or the cavity within which the device is disposed. The material 712A and/or 712B can form a continuous loop around the device and/or cavity, in some cases. For example, in the set of embodiments illustrated in FIG. 7B, electrically and/or thermally conductive material portion 712A is shown as a continuous loop that circumscribes volume 708 and device 706. The material 712A and/or 712B can be formed on the cap and/or resonator as a continuous loop that circumscribes the resonator and/or cavity prior to modifying (e.g., via heating) the electrically conductive material to form the seal. In other cases, the material 712A and/or 712B can be formed on the cap and/or resonator as a discontinuous loop and, after modifying the material (e.g., via heating and melting a component of the electrically conductive material), a continuous loop circumscribing the device and/or cavity can be formed. By forming the material 712A and/or 712B as a substantially continuous loop circumscribing the device and/or cavity, one can ensure that the resonator cavity is sufficiently sealed. In one embodiment, the material 712A may form a continuous loop while the material 712B may form one or more discrete pillars (alternatively referred to as vias).

The electrically and/or thermally conductive material may comprise a variety of materials. In some embodiments, all or part of the material 712A and/or 712B can be formed of a metal including, but not limited to, gold, silver, copper, tin, and/or an alloy of these. The material 712A and/or 712B can comprise, in some embodiments, a solder such as SnAgCu (i.e., SAC) solder, Au/Sn solder, and/or Ag/Sn solder. As mentioned previously, in some embodiments a eutectic bond may be desired, and thus suitable materials for forming a eutectic bond may be implemented (e.g., aluminum and germanium for forming an Al/Ge eutectic bond, or any other suitable eutectic materials). In some embodiments, all or part of the material 712A and/or 712B can be formed of an electrically conductive polymer. Examples of such polymers include intrinsically conductive polymers (e.g., polypyrroles (PPY), polycarbazoles, poly(p-phenylebe sulfide) (PPS), poly(acetylene) (PA), poly(p-phenylene vinylebe) (PPV), etc.) and non-conductive polymers that have been combined with an electrically conductive material (e.g., a non-conductive polymer paste mixed with metal particles). In some embodiments, portions 712A and 712B can be formed of the same material, which can simplify fabrication of the packaged device. It should be understood, however, that in other cases, portions 712A and 712B can be formed of different materials.

In those embodiments in which the material 712A and/or 712B is electrically conductive, the composition of the electrically conductive material can be selected to provide a desired level of electrical conductivity. In some embodiments, the electrically conductive material can have an electrical resistivity of less than about 1000 $\Omega$cm, less than about 10 $\Omega$cm, less than about 1 $\Omega$cm, less than about 0.01 $\Omega$cm, less than about 1×10-3 $\Omega$cm, less than about 1×10-4 $\Omega$cm, less than about 1×10-5 $\Omega$cm, less than about 1×10-6 $\Omega$cm, less than about $1\times10$-8 $\Omega$cm, between about $1\times10$-10 $\Omega$cm and about 1000 $\Omega$cm, between about $1\times10$-10 $\Omega$cm and about 10 $\Omega$cm, between about $1\times10$-10 $\Omega$cm and about 1 $\Omega$cm, between about $1\times10$-10 $\Omega$cm and about 0.01 $\Omega$cm, between about $1\times10$-10 $\Omega$cm and about $1\times10$-3 $\Omega$cm between about $1\times10$-10 $\Omega$cm and about $1\times10$-4 $\Omega$cm, between about $1\times10$-10 $\Omega$cm and about $1\times10$-5 $\Omega$cm or between about $1\times10$-10 $\Omega$cm and about $1\times10$-6 $\Omega$cm.

In those embodiments in which the material 712A and/or 712B is thermally conductive, the composition of the material may be selected to provide a desired level of thermal conductivity. The use of electrically conductive materials that are also thermally conductive can assist in transporting heat away from the resonator or other device (e.g., in cases where relatively high power electronics are employed), which can enhance the performance of the resonator or other device. In some embodiments, the electrically conductive material can be selected to have a thermal conductivity of at least about 5 W/mK, at least about 10 W/mK, at least about 50 W/mK, at least about 100 W/mK, at least about 1000 W/mK, between about 5 W/mK and about 5000 W/mK, between about 10 W/mK and about 5000 W/mK, between about 50 W/mK and about 5000 W/mK, between about 100 W/mK and about 5000 W/mK, or between about 1000 W/mK and about 5000 W/mK.

In some embodiments in which a substrate is capped, the packaged device (e.g., packaged micromechanical resonator) is constructed and arranged such that an electrical signal may be transmitted between the device on the substrate (e.g., the micromechanical resonator within the sealed volume) and integrated circuitry outside the sealed volume (e.g., on the cap) through the electrically conductive material (e.g., material portion 712A and/or one or more of portions 712B). For example, in some embodiments, a supply voltage can be transmitted through the electrically conductive material between the substrate and integrated circuitry on the cap. The electrically conductive material may be part of an electrically conductive pathway used to actuate the device (e.g., to actuator a resonator on the substrate), detect vibration of the device (e.g., resonator), and/or otherwise control the device. In some cases, the electrically conductive material is used as part of a ground electrical connection and transmits a ground signal between the substrate and the cap.

As noted above, a signal can be transmitted through electrically conductive material portion 712A and/or one or more of electrically conductive material portions 712B. In some embodiments, electrically conductive material portion 712A can provide a seal between the substrate 704 and the cap 710 and transmit any of the signals described herein (in the presence or absence of electrically conductive material portions 712B). In other embodiments, electrically conductive material portion 712A can be used solely to provide a seal between the substrate 704 and the cap 710, without transmitting any signals, and electrically conductive material portions 712B can be used to transmit any of the signals described herein.

Although the continuous loop of material 712A in FIG. 7B is shown as being disconnected from material portions 712B and the resonator electrode material, it should be understood that, in other embodiments, the continuous loop of material 712A can be in physical contact with one or more electrodes of the resonator and/or one or more of material portions 712B. In some embodiments, material portion 712A might only be in contact with substrate 714 and cap 710, and constructed and arranged such that no signals are transmitted through portion 712A. In still other cases, material portion 712A might be connected to one or more electrodes of the resonator and/or one or more material portions 712B at a different device level (e.g., through one or more vias).

Figure 8:
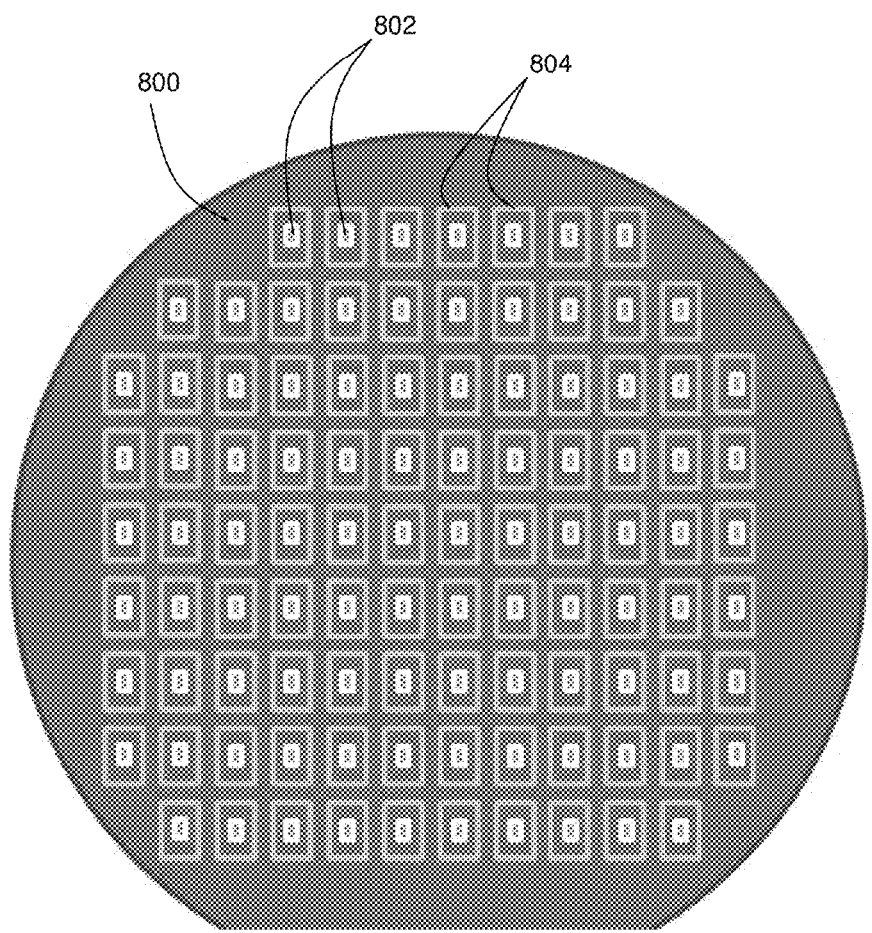
FIG. 8 illustrates a substrate including a plurality of resonators circumscribed by sections of electrically conductive material, according to one embodiment.

While FIGS. 7A-7B illustrate the deposition of the bonding material (e.g., on the substrate and/or cap) and sealing of the substrate to the cap for a single device, it should be understood that deposition of the bonding material and/or sealing of the substrate to the cap can also be performed for several devices simultaneously (e.g., at the wafer level in a traditional microfabrication process). FIG. 8 includes a schematic diagram of a wafer substrate 800 comprising a plurality of devices 802 (e.g., resonators), as a non-limiting example of a device of interest. Each of the resonators may be a piezoelectric resonator including a micromechanical resonating structure and may be surrounded by an electrically conductive material 804, which can be used as a bonding material to form a seal between wafer substrate 800 and a wafer cap (not shown).

According to one aspect of the technology described herein, a substrate/wafer including a device may be capped by a "generic" CMOS cap. The CMOS cap may be "generic" in the sense that, according to some embodiments, it need not be physically arranged to facilitate operation of the device on the substrate/wafer. For example, the substrate/wafer may include a device whose operation is not impacted, or not significantly impacted, by the particular physical surroundings/environment. As a non-limiting example, the device 706 may be a MEMS resonator whose operation is not significantly impacted by the characteristics of the volume 708 in which it is disposed, including the size of the cavity, the pressure, etc. In such instances, a generic cap 710 may be used which need not be physically arranged to provide any particular characteristics of the volume 708. Rather, the cap 710 may take any physical configuration suitable for mating to the substrate 704, and may include any suitable circuitry for interacting with the device 706.

One advantage of those aspects described herein in which a "generic" CMOS cap may be used to form a sealed device is that the design of the cap may be decoupled from the design of the substrate and resonator such that a variety of cap designs can be employed without affecting the performance of the resonator. That is to say, in some embodiments described herein, the performance of resonator is not dependent upon the form factor, material of construction, or any other property of the cap. As a result, a variety of caps with different "generic" configurations can be interchanged in the manufacturing process without affecting the performance of the resonator. For example, a first set of packaged resonators may be produced by sealing a cap comprising a substantially flat semiconductor wafer (or portion of a semiconductor wafer) to a substrate, and a second set of packaged resonators may be produced by sealing a cap including a cavity on the sealing surface to a substrate. In addition, caps provided by outside vendors can be integrated into the manufacturing process without the need to adjust the design of the substrate, resonator, and/or assembly equipment in view of the cap design.

It should be appreciated from the foregoing discussion that one or more aspects described herein are not limited to use with any particular types of MEMS structure. For example, non-limiting embodiments have been described as implementing a MEMS resonator, though other devices are possible. Non-limiting examples of suitable alternative MEMS devices include microphones, pressure sensors, accelerometers, and gyroscopes, among others.

In those embodiments in which a MEMS resonator is implemented, the MEMS resonator may be any suitable type of MEMS resonator. According to a non-limiting embodiment, the MEMS resonator may be a piezoelectric resonator having a piezoelectric active layer. Non-limiting examples are described in the above-referenced patent application Ser. Nos. 12/781,076 and 13/191,851. For purposes of illustration, a suitable non-limiting example is illustrated in FIGS. 9A and 9B and now described.

Figure 9A:
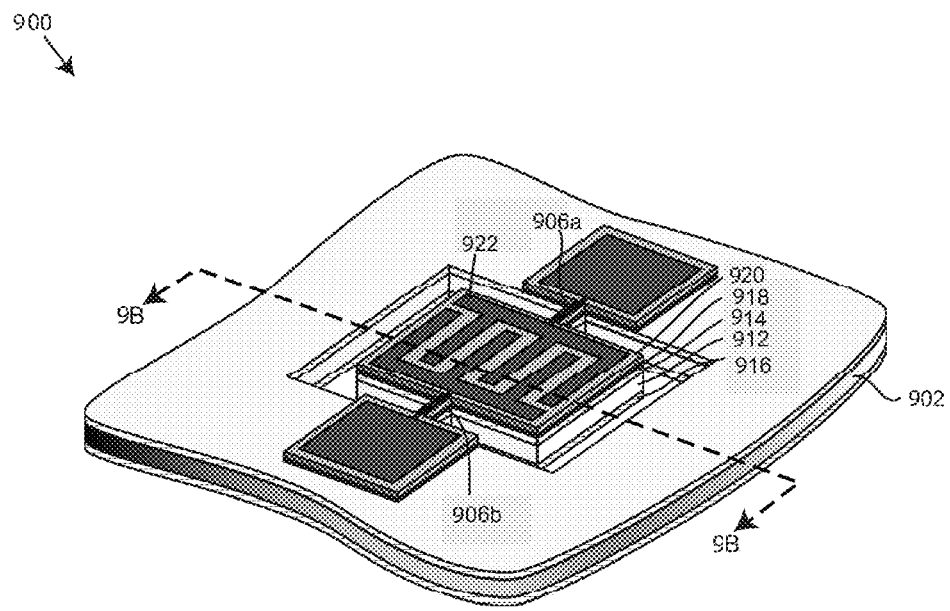
FIGS. 9A and 9B illustrate a perspective view and a cross-sectional view, respectively, of a resonating structure as may be used according to various aspects described herein.
Figure 9B:
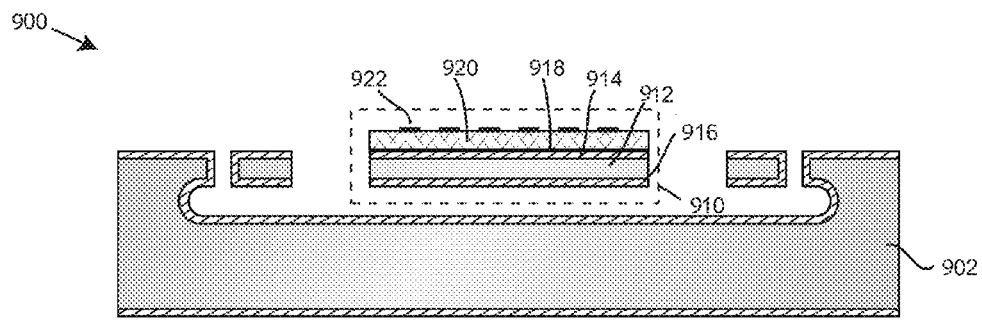

FIGS. 9A and 9B provide a perspective view and a more detailed cross-sectional view, respectively, of a device 900 including a mechanical resonating structure 910. As illustrated, the micromechanical resonating structure 910 (reference number shown in FIG. 9B) may include an active layer 920 (e.g., a piezoelectric layer, for example made of aluminum nitride, or any other suitable piezoelectric material), a bottom conducting layer 918 (e.g., a metal electrode), and one or more top electrodes 922. The active layer 920 may be actuated by applying a voltage/electric field thereto using top electrodes 922 (formed, for example, of a metal) and bottom conducting layer 918, which in some embodiments may be configured as a ground plane. Not all the illustrated components are required and other components may be included in some embodiments, as the illustration provides a non-limiting example of a mechanical resonating structure.

The micromechanical resonating structure 910 also includes a silicon layer 912, a silicon oxide layer 914 on the top surface of the silicon layer 912, and a silicon oxide layer 916 on the bottom surface of the silicon layer 912. The combination of silicon layer 912 and silicon oxide layers 914 and 916 may operate as a temperature compensation structure (a temperature compensation stack in this configuration) to compensate temperature-induced changes in the frequency of operation of mechanical resonating structure 910. For example, one manner in which to improve the temperature drift of silicon resonators is to add another layer of material on the silicon that, instead of softening with temperature, as is the case for silicon, hardens with temperature, as is the case for quartz and silicon dioxide. As disclosed in U.S. patent application Ser. No. 12/639,161 filed on Dec. 16, 2009, entitled MECHANICAL RESONATING STRUCTURES INCLUDING A TEMPERATURE COMPENSATION STRUCTURE, and published as U.S. Patent Application Publication No. US-2010-0182102-A1 on Jul. 22, 2010, incorporated herein by reference in its entirety, a stack of two silicon oxide layers on the top and bottom of the silicon, respectively, can be implemented with a piezoelectric stack on either the top or bottom oxide (see, for example, FIGS. 9A and 9B). It should be appreciated that the silicon layer 912 may be formed of any suitable semiconductor material, and that silicon is a non-limiting example described herein for purposes of illustration. Similarly, layers 914 and 916 may be formed of any suitable material (e.g., other types of oxide), as silicon oxide is a non-limiting example. Also, as mentioned, not all the illustrated components are required and other components may be included in some embodiments, as the illustration provides a non-limiting example of a mechanical resonating structure.

The micromechanical resonating structure may be connected to a substrate 902 by two or more anchors. As shown in FIG. 9A, the micromechanical resonating structure 910 is connected to the substrate 902 by two anchors, 906a and 906b, which may be flexible in some embodiments. The number of anchors is not limiting, as any suitable number may be used. It should further be understood that the geometry of the anchors may be matched to a specific length to reduce the amount of acoustic energy transferred from the micromechanical resonating structure to the substrate. Suitable anchor structures that reduce stress and inhibit energy loss are described in U.S. patent application Ser. No. 12/732,575, filed Mar. 26, 2010, published as U.S. Patent Publication No. 2010/0314969 and entitled "Mechanical Resonating Structures and Methods", which is hereby incorporated herein by reference in its entirety.

As mentioned, various types and forms of mechanical resonating structures may be used with those aspects of the present technology relating to mechanical resonating structures, and FIGS. 9A and 9B provide only a non-limiting example. For example, the mechanical resonating structure may comprise or be formed of any suitable material(s) and may have any composition. According to some embodiments, the mechanical resonating structure may comprise a piezoelectric material (e.g., active layer 920). According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonating structure comprises a piezoelectric material, the piezoelectric material may be single crystal material, although in other embodiments including a piezoelectric material the piezoelectric material may be polycrystalline.

The mechanical resonating structure may have any shape, as the shape illustrated in FIGS. 9A and 9B is a non-limiting example. For example, aspects of the technology may apply to mechanical resonating structures that are substantially rectangular, substantially ring-shaped, substantially disc-shaped, or that have any other suitable shape. As additional, non-limiting examples, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Moreover, the mechanical resonating structure may have one or more beveled edges. According to some embodiments, the mechanical resonating structure may be substantially planar. Moreover, geometrical and structural alterations can be made to improve quality (e.g., Q-factor, noise) of a signal generated by the mechanical resonating structure.

The mechanical resonating structures described herein may have any suitable dimensions, and in some embodiments may be micromechanical resonating structures. The mechanical resonating structure may have any suitable thickness, and in some embodiments the thickness may be related to a wavelength of a desired oscillation mode.

According to some embodiments, the mechanical resonating structures described herein have a large dimension (e.g., the largest of length, width, diameter, circumference, etc. of the mechanical resonating structure) of less than approximately 1000 microns, less than approximately 100 microns, less than approximately 50 microns, or any other suitable value. It should be appreciated that other sizes are also possible. According to some embodiments, the devices described herein form part or all of a microelectromechanical system (MEMS).

The mechanical resonating structures may have any desired resonance frequencies and frequencies of operation, and may be configured to provide output signals of any desired frequencies. For example, the resonance frequencies and/or frequencies of operation of the mechanical resonating structures, and the frequencies of the output signals provided by the mechanical resonating structures, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the listed frequencies are not limiting.

The mechanical resonating structures may be operated in various acoustic modes, including but not limited to Lamb waves, also referred to as plate waves including flexural modes, bulk acoustic waves, surface acoustic waves, extensional modes, translational modes and torsional modes. The selected mode may depend on a desired application of the mechanical resonating structure.

The mechanical resonating structure may be actuated and/or detected in any suitable manner, with the particular type of actuation and/or detection depending on the type of mechanical resonating structure, the desired operating characteristics (e.g., desired mode of operation, frequency of operation, etc.), or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators. Such Lamb wave devices may operate based on propagating acoustic waves, with the edges of the structure serving as reflectors for the waves. For such devices, the spacing between the edges of the resonating structure may define the resonance cavity, and resonance may be achieved when the cavity is an integer multiple of pitch p, where p=λ/2, with λ being the acoustic wavelength of the Lamb wave of interest, understanding that the device may support more than one mode of Lamb waves. However, it should be appreciated that aspects of the technology described herein apply to other types of structures as well, and that Lamb wave structures are merely non-limiting examples.

As should be appreciated from FIGS. 9A and 9B, in some embodiments suspended mechanical resonating structures are used, meaning that the mechanical resonating structure(s) may have one or more free sides. Referring to FIG. 9A, the mechanical resonating structure 910 has free ends and the sides are also substantially free, connected to the substrate 902 by anchors 906a and 906b.

While a non-limiting example of a suitable MEMS resonator has been described with respect to FIGS. 9A and 9B, it should be appreciated that additional and/or alternative structures are also possible. For example, the resonators 202 and 302 may alternatively be different types of MEMS devices. For instance, the resonators 202 and 302 may alternatively be a MEMS microphone, a MEMS pressure sensor, a gyroscope, an accelerometer, or any other suitable MEMS device.

Figure 10:
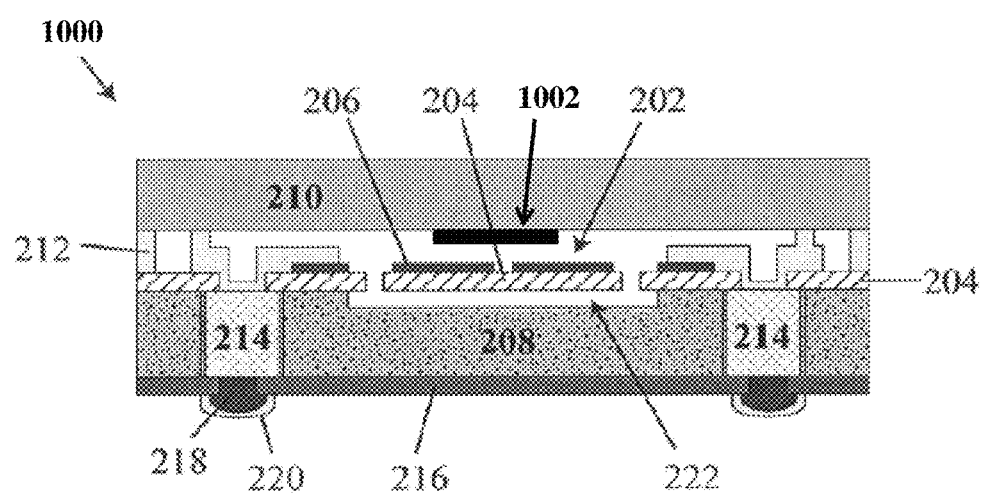
FIG. 10 illustrates a device having a piezoelectric resonator integrated with a substrate and capped by a cap including an electrode for actuating the piezoelectric resonator, according to a non-limiting embodiment.

While some of the above-described aspects have been described as applying to MEMS devices actuated in-plane (e.g., the mechanical resonating structure of FIGS. 9A and 9B), it should be appreciated that not all aspects are limited in this respect. According to one aspect of the present application, a capped MEMS device is provided in which the cap includes one or more electrodes configured to actuate and/or sense the capped MEMS device across a gap. A non-limiting example is illustrated in FIG. 10, which illustrates a device 1000, representing a modification of device 200 of FIG. 2 with the addition of an electrode 1002 on cap 210. In such embodiments, the MEMS structure may be activated with electrostatic actuation and/or sensed electrostatically. The electrode 1002 may be part of integrated circuitry on the cap, or the cap may lack integrated circuitry As an alternative to the configuration of FIG. 10, the electrode 1002 may instead be positioned on the substrate 208.

Whether the MEMS structure is a resonator, microphone, or any other MEMS device, it may be desirable in some embodiments to include structures in the cap such as heaters and/or thermistors. In some such embodiments, the heaters and/or thermistors may be integrated with the cap. Non-limiting examples have been described in the above-referenced U.S. patent application Ser. No. 12/781,076 (the '076 application), which is incorporated herein by reference in its entirety. FIG. 1 of that application is reproduced herein as FIG. 11.

Figure 11:
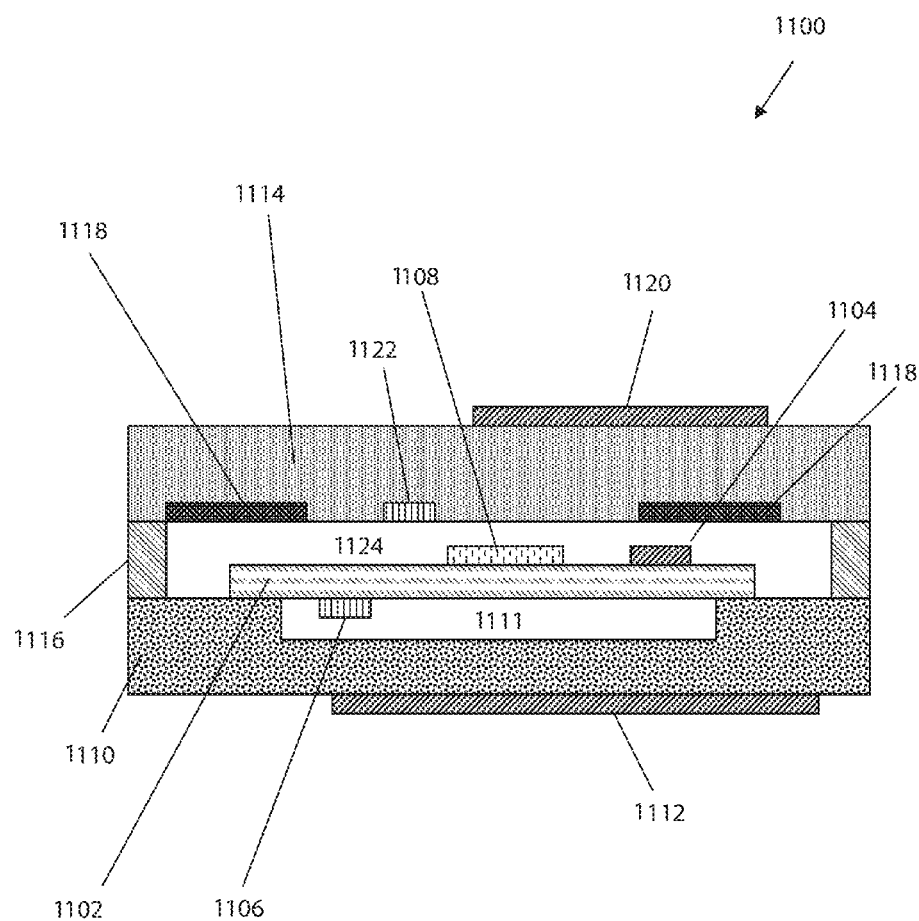
FIG. 11 illustrates a cross-sectional view of a capped mechanical resonating structure including heating elements and temperature sensors, according to a non-limiting embodiment.

As shown in the cross-sectional view of FIG. 11, the device 1110 includes a mechanical resonating structure 1102, which itself includes a heating element 1104, a temperature sensor 1106, and one or more electrodes 1108. The mechanical resonating structure 1102 is connected to and, in the non-limiting example of FIG. 11, suspended above a substrate 1110, thus creating a gap 1111. A heating element 1112 is optionally formed on a backside of the substrate 1110. The substrate 1110 is bonded to a cap wafer 1114 by a bonding layer 1116, which may be any of the types of bonding layers and configurations described herein. In the non-limiting example of FIG. 11, the cap wafer 1114 includes integrated circuitry 1118, and also optionally includes a heating element 1120 and a temperature sensor 1122. The mechanical resonating structure 1102 is separated from the cap wafer 1114 in the non-limiting example of FIG. 11 by a gap 1124. In some non-limiting embodiments, the mechanical resonating structure is formed within a vacuum environment, as previously described herein.

The heating elements and temperature sensors of FIG. 11 may be any suitable structures for heating and sensing the temperature of the mechanical resonating structure (or other MEMS device in those embodiments in which the MEMS device is not a resonator). Thus, they may have any suitable configurations, may be positioned at any suitable locations, and may be formed of any suitable materials. One or more heaters may be integrated with the cap wafer. Similarly, one or more temperature sensors may be integrated with the cap wafer.

According to a non-limiting embodiment, the temperature sensor may be a layer of material, or may be formed of multiple layers. The temperature sensor may be a resistive line, a p-n junction, a magnetic temperature sensor, or a bi-metal structure, as non-limiting examples. Similarly, any heater could be formed of the same types of structures, as non-limiting examples.

It should also be appreciated that while a heater and/or temperature sensor may be formed on a cap of a capped MEMS device in some non-limiting embodiments, a heater and/or temperature sensor may alternatively or in addition be formed directly on the MEMS device (e.g., directly on a mechanical resonating structure. Such heaters and/or temperature sensors may be any of the types previously described or any other suitable type.

If a heater is included (on the MEMS device itself, on the cap, or elsewhere), it may be used for any suitable purpose. According to a non-limiting, a heater may be used to control the device temperature, for example to maintain a constant temperature during operation. The heater may be used to adjust the temperature of the device, for example during testing of a part or during recalibration in the field. In any such embodiment, a closed loop feedback circuit configuration may be implemented including the heater and a temperature sensor. Alternatively, an open-loop configuration may be implemented.

It should be appreciated from the foregoing discussion that, according to a non-limiting embodiment, a device like that illustrated in FIG. 11 (or FIGS. 2 and 3, as non-limiting examples) may include a cap wafer lacking integrated circuitry (i.e., lacking integrated circuitry 118 but having an integrated temperature sensor (e.g., temperature sensor 1122). The temperature sensor, which in some non-limiting embodiments may be a thermistor, may represent passive circuitry, and thus the cap 1114 may also lack active circuitry. In other words, according to a non-limiting embodiment a capped MEMS device (e.g., a MEMS resonator) is capped with a cap wafer including no circuitry other than a temperature sensor. Alternatively, or in addition, the cap may include an integrated heater, still without integrated circuitry.

In those non-limiting embodiments in which the cap includes a temperature sensor but the device does not include a heater and/or integrated circuitry, the device may be configured to connect to external circuitry which may receive the temperature signal from the temperature sensor. The external circuitry may therefore monitor the temperature of the device and may, in some embodiments, control adjustment of the temperature of the device.

Figure 12:
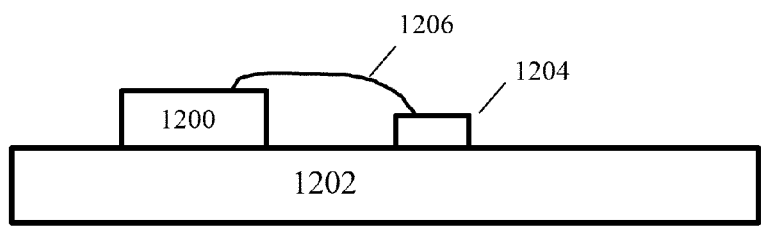
FIG. 12 illustrates a non-limiting example of a capped MEMS device connected to external circuitry, according to a non-limiting embodiment.

It should be appreciated from the foregoing discussion that in some embodiments a capped MEMS device may be provided which may be coupled to external circuitry. For example, in those embodiments in which the capped MEMS device lacks integrated circuitry (on the cap itself or on a substrate of the MEMS device), control and/or detection of the operation of the MEMS device may be performed by circuitry external to the capped MEMS device. A non-limiting example is illustrated in FIG. 12.

As shown, a capped MEMS device 1200 may be mounted to a substrate 1202. The substrate 1202 may include circuitry 1204 coupled to the capped MEMS device. The capped MEMS device, which may be any of the previously illustrated or described capped MEMS structures (e.g., of FIGS. 2, 3, 11, or otherwise), may include a cap lacking integrated circuitry. The capped MEMS device as a whole may lack integrated circuitry according to a non-limiting embodiment. Thus, according to a non-limiting embodiment, control and/or detection of the operation of the capped MEMS device may be performed by circuitry 1204.

The circuitry 1204 may be any suitable circuitry for controlling and/or detecting operation of the capped MEMS device 1200. The circuitry 1204 may be integrated circuitry or may be any other suitable type of circuitry. In one embodiment, the capped MEMS device may be provided by a first manufacturer, the circuitry 1204 may be provided by a second manufacturer, and the two coupled together on the substrate 1202. The substrate 1202 may be any suitable type of substrate, including but not limited to, a semiconductor substrate, a glass substrate, a printed circuit board, or any other suitable type of substrate. The capped MEMS device 1200 may be coupled to the circuitry 1204 in any suitable manner, for example by wire bond 1206, conductive trace, or in any other suitable manner. Because the coupling between the device 1200 and the circuitry 1204 may act as a radiator, which may negatively impact operation of the device 1200 (e.g., through electrical interference), it may be preferable in at least some embodiments to have the integrated circuitry on the cap wafer.

According to a non-limiting aspect of the present application, the cap wafer may itself include a MEMS structure. For example, referring to FIG. 2, the cap 210 may include a MEMS device of the same type or different type than that on substrate 208. According to a non-limiting embodiment, the cap 210 may include a MEMS gyroscope, such that the device 200 may include a MEMS resonator capped by a MEMS gyroscope. According to an alternatively embodiment, the cap 210 may include a second MEMS resonator, such that the device 200 may include two MEMS resonators bonded to each other in a face-to-face configuration. Further non-limiting embodiments may include devices exhibiting any of the following combinations of MEMS structures on the cap wafer and the substrate: resonator-resonator; resonator-gyroscope; gyroscope-resonator; resonator-microphone; microphone-resonator; gyroscope-accelerometer; accelerometer-gyroscope; resonator-pressure sensor; pressure sensor-resonator.

Figure 13:
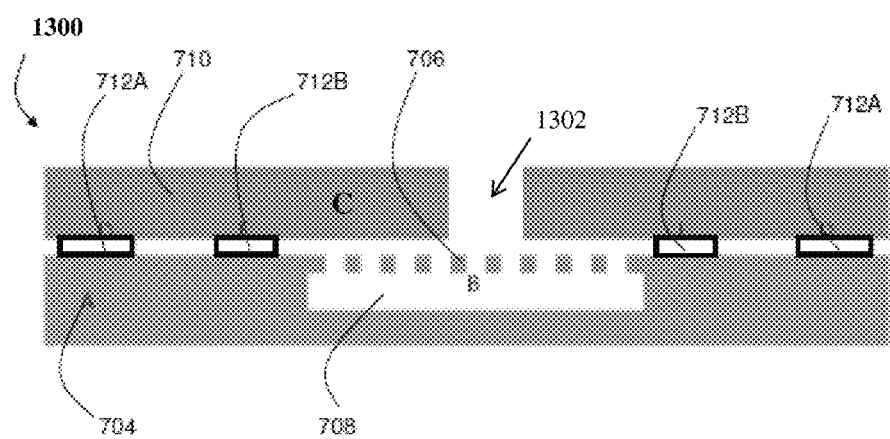
FIG. 13 illustrates a capped MEMS device in which an access hole is provided in the cap, according to a non-limiting embodiment.

According to a non-limiting embodiment, a cap wafer of a capped MEMS device may include an access hole. For example, an access hole may be desirable if the MEMS device is a pressure sensor, as a non-limiting example. FIG. 13 illustrates an example, representing a modification of the device of FIG. 7A. In contrast to the device 700 of FIG. 7A, the cap 710 of the device 1300 in FIG. 13 includes an access hole 1302. The MEMS device 706 may in the embodiment of FIG. 13 may be a pressure sensor, though this is a non-limiting example. Access holes may be provided in cap wafers capping other types of MEMS structures, including microphones, gyroscopes, or other devices. The access hole 1302 may be formed in any suitable manner and may have any suitable dimensions to provide sufficient access to the MEMS device 706. More than one access hole may be provided in some embodiments, as the number may be chosen to provide suitable access to the device 706.

It should be appreciated that various alterations and modifications to the examples described above are possible. For example, while some of the embodiments have been described as including piezoelectric resonators, it should be appreciated that such structures are not limiting. Some of the techniques described herein may be used to form piezoelectric filters, piezoelectric sensors, or other devices, and resonators should be understood to be merely one non-limiting example.

Having thus described several aspects of at least one embodiment of the technology, it is to be appreciated that various alterations, modifications, and improvements will readily occur to those skilled in the art. Such alterations, modifications, and improvements are intended to be within the spirit and scope of the invention. Accordingly, the foregoing description and drawings provide non-limiting examples only.

For example, the devices 200 and 300 have been shown as including caps 210 and 310. Alternatively, thin film layers may be formed by deposition to create a seal (e.g., a hermetic seal), without bonding of a cap wafer. Other configurations are also possible.

What is claimed is:

1. An apparatus, comprising:
   a first microelectromechanical systems (MEMS) wafer comprising a first MEMS device; and
   a second MEMS wafer comprising a second MEMS device,
   wherein the second MEMS wafer is configured to cap the first MEMS wafer, and wherein the first and second MEMS wafers are bonded together in a face-to-face configuration.

2. The apparatus of claim 1, wherein the first MEMS device is a MEMS resonator and wherein the second MEMS device is a MEMS gyroscope.

3. The apparatus of claim 1, wherein the first and second MEMS wafers are bonded together by a eutectic bond.

4. The apparatus of claim 1, wherein the first MEMS device is configured to be actuated via electrostatic actuation.

5. The apparatus of claim 1, wherein the first MEMS device is a MEMS microphone.

6. The apparatus of claim 1, wherein the second MEMS wafer includes one or more access holes.

* * * * *